US012615922B2

(12) United States Patent
Han et al.

(10) Patent No.: US 12,615,922 B2
(45) Date of Patent: Apr. 28, 2026

(54) DISPLAY SUBSTRATE, DISPLAY PANEL AND DISPLAY APPARATUS

(71) Applicant: BOE TECHNOLOGY GROUP CO., LTD., Beijing (CN)

(72) Inventors: Ying Han, Beijing (CN); Pan Xu, Beijing (CN); Wei Li, Beijing (CN); Yichi Zhang, Beijing (CN); Ying Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 725 days.

(21) Appl. No.: 17/789,158

(22) PCT Filed: Jun. 25, 2021

(86) PCT No.: PCT/CN2021/102536
§ 371 (c)(1),
(2) Date: Jun. 24, 2022

(87) PCT Pub. No.: WO2022/267054
PCT Pub. Date: Dec. 29, 2022

(65) Prior Publication Data
US 2024/0179949 A1 May 30, 2024

(51) Int. Cl.
*H10K 59/122* (2023.01)
*H10K 59/121* (2023.01)
(Continued)

(52) U.S. Cl.
CPC ......... *H10K 59/123* (2023.02); *H10K 59/122* (2023.02); *H10K 59/1315* (2023.02);
(Continued)

(58) Field of Classification Search
CPC ............. H10K 59/123; H10K 59/1315; H10K 59/80516; H10K 59/353; H10K 59/121
See application file for complete search history.

(56) References Cited

U.S. PATENT DOCUMENTS

| | | | |
|---|---|---|---|
| 2015/0102294 A1 | 4/2015 | Choi et al. | |
| 2016/0203748 A1 | 7/2016 | Matsueda et al. | |

(Continued)

FOREIGN PATENT DOCUMENTS

| | | |
|---|---|---|
| CN | 103296052 A | 9/2013 |
| CN | 104898888 A | 9/2015 |

(Continued)

OTHER PUBLICATIONS

European Patent Office, Extended European Search Report, issued Oct. 17, 2023, Application No. EP21946546.5.
(Continued)

*Primary Examiner* — Aaron J Gray
(74) *Attorney, Agent, or Firm* — HOUTTEMAN LAW LLC

(57) ABSTRACT

A display substrate includes: a base substrate; a plurality of pixel circuits on the base substrate; and a plurality of pixels; the pixel includes a first sub-pixel, a second sub-pixel and a third sub-pixel; orthographic projections of the first sub-pixel, the second sub-pixel and the third sub-pixel on the base substrate do not overlap with each other; the first sub-pixel, the second sub-pixel and the third sub-pixel are electrically connected to the pixel circuits in a one-to-one correspondence manner; a first distance in a first direction exists between the first sub-pixel and the second sub-pixel, and a first via is arranged in the first distance; a second distance in the first direction exists between the first sub-pixel and the third sub-pixel, and a first via is arranged in the second distance; a third distance in the first direction exists between the second sub-pixel and the third sub-pixel.

7 Claims, 21 Drawing Sheets

(51) Int. Cl.

| | | |
|---|---|---|
| *H10K 59/123* | (2023.01) |
| *H10K 59/131* | (2023.01) |
| *H10K 59/35* | (2023.01) |
| *H10K 59/80* | (2023.01) |

(52) U.S. Cl.

CPC ..... *H10K 59/353* (2023.02); *H10K 59/80516* (2023.02); *H10K 59/121* (2023.02)

(56) References Cited

U.S. PATENT DOCUMENTS

| | | | | |
|---|---|---|---|---|
| 2017/0148865 | A1* | 5/2017 | Cho | H10K 59/80522 |
| 2017/0205932 | A1* | 7/2017 | Yang | G06F 3/0412 |
| 2018/0097047 | A1* | 4/2018 | Jung | H10K 59/124 |
| 2018/0151635 | A1* | 5/2018 | Cao | H10K 50/865 |
| 2018/0233547 | A1* | 8/2018 | Chung | H10K 59/122 |
| 2018/0277040 | A1* | 9/2018 | Lee | H10K 59/805 |
| 2019/0115403 | A1* | 4/2019 | Kang | H10K 59/122 |
| 2019/0212610 | A1 | 7/2019 | Kim et al. | |
| 2020/0089047 | A1 | 3/2020 | Baek et al. | |
| 2021/0050388 | A1 | 2/2021 | Song | |
| 2021/0104578 | A1 | 4/2021 | Jo et al. | |

FOREIGN PATENT DOCUMENTS

| | | | |
|---|---|---|---|
| CN | 105261632 | A | 1/2016 |
| CN | 106773249 | A | 5/2017 |
| CN | 107219674 | A | 9/2017 |
| CN | 107331685 | A | 11/2017 |
| CN | 107887404 | A | 4/2018 |
| CN | 108267882 | A | 7/2018 |
| CN | 108417601 | A | 8/2018 |
| CN | 108573993 | A | 9/2018 |
| CN | 109801559 | A | 5/2019 |
| CN | 110444696 | A | 11/2019 |
| CN | 110783380 | A | 2/2020 |
| CN | 110828525 | A | 2/2020 |
| CN | 111430403 | A | 7/2020 |
| CN | 212182329 | U | 12/2020 |
| CN | 112216219 | A | 1/2021 |
| CN | 112748609 | A | 5/2021 |
| JP | 2008135325 | A | 6/2008 |
| WO | 2020161575 | A1 | 8/2020 |
| WO | 2021156902 | A1 | 8/2021 |

OTHER PUBLICATIONS

China Patent Office, First Office Action, Dec. 23, 2025, for corresponding CN application No. 202180001641.7.

* cited by examiner

DISPLAY SUBSTRATE, DISPLAY PANEL AND DISPLAY APPARATUS

TECHNICAL FIELD

Embodiments of the present disclosure belong to the field of display technology, and in particular relate to a display substrate, a display panel and a display apparatus.

BACKGROUND

At present, an Organic Light-Emitting Diode (OLED) display panel is also called an Organic electroluminescent display panel or an Organic Light-Emitting semiconductor display panel. Color gamut is an important index for evaluating the OLED display panel, and high-color-gamut display may bring better visual experience to a user, and is an index mainly pursued in new product development at present.

SUMMARY

The embodiment of present disclosure provides a display substrate, a display panel and a display apparatus.

In a first aspect, an embodiment of the present disclosure provide a display substrate, including:

a base substrate;

a plurality of pixel circuits on the base substrate; and a plurality of pixels in an array and on a side of the plurality of pixel circuits away from the base substrate;

wherein each of the plurality of pixels includes a first sub-pixel, a second sub-pixel and a third sub-pixel; orthographic projections of the first sub-pixel, the second sub-pixel and the third sub-pixel on the base substrate do not overlap with each other; the first sub-pixel, the second sub-pixel and the third sub-pixel are electrically connected to corresponding ones of the plurality of pixel circuits in a one-to-one correspondence;

the first sub-pixel and the second sub-pixel are separated from each other by a first distance in a first direction, and a first via is arranged in the first distance;

the first sub-pixel and the third sub-pixel are separated from each other by a second distance in the first direction, and a first via is arranged in the second distance; and the second sub-pixel and the third sub-pixel are separated from each other by a third distance in the first direction.

In some embodiments, each of the plurality of pixel circuits includes a driving transistor and an insulating layer; each of the first sub-pixel, the second sub-pixel and the third sub-pixel includes an anode; the driving transistor, the insulating layer and the anode are sequentially arranged away from the base substrate;

the pixel circuit further includes an auxiliary electrode;

the auxiliary electrode includes a first conductive layer, the first conductive layer is in a same layer as the anode, and an orthographic projection of the first conductive layer on the base substrate and an orthographic projection of the anode on the base substrate do not overlap with each other; and the auxiliary electrode further includes a second conductive layer, the second conductive layer is in a same layer as a first electrode and a second electrode of the driving transistor, and an orthographic projection of the second conductive layer on the base substrate and an orthographic projection of the first electrode and the second electrode of the driving transistor on the base substrate do not overlap with each other.

In some embodiments, in each of the plurality of pixels, the second sub-pixel and the third sub-pixel are on a same side of the first sub-pixel; the second sub-pixel and the third sub-pixel are arranged in a second direction;

the first distance is equal to the second distance; and the third distance is less than the first distance.

In some embodiments, the first sub-pixel and the third sub-pixel are arranged in the first direction;

the first direction is perpendicular to the second direction.

In some embodiments, in the pixel, a size of the first sub-pixel in the second direction is equal to a sum of sizes of the second sub-pixel, the third sub-pixel and a space between the second sub-pixel and the third sub-pixel in the second direction; and a size of the first sub-pixel in the first direction is less than a size of any one of the second sub-pixel and the third sub-pixel in the first direction.

In some embodiments, an orthographic projection of the first conductive layer on the base substrate is in an orthographic projection of a spacer region between at least a part of pixels adjacent to each other in the first direction on the base substrate.

In some embodiments, a size of the first conductive layer in the second direction is equal to a sum of sizes of two pixels adjacent to each other in the second direction and a space between the two pixels, in the second direction; and a size of the first conductive layer in the first direction is less than a size of the first sub-pixel in the first direction.

In some embodiments, the first distance is equal to the second distance; and the third distance is equal to a sum of the first distance, the second distance, and a width of the first sub-pixel in the first direction.

In some embodiments, in the pixel, the second sub-pixel, the first sub-pixel, and the third sub-pixel are sequentially arranged in the first direction.

In some embodiments, a size of the first conductive layer in the first direction is greater than a sum of sizes of the first sub-pixel and the second sub-pixel in the first direction; or the size of the first conductive layer in the first direction is greater than a sum of the sizes of the first sub-pixel and the third sub-pixel in the first direction; and;

a size of the first conductive layer in a second direction is less than a size of the first sub-pixel in the second direction.

In some embodiments, the first distance is less than the second distance; and the second distance is equal to a sum of the first distance, a width of the second sub-pixel in the first direction, and the third distance.

In some embodiments, in the pixel, the second sub-pixel, the third sub-pixel, and the first sub-pixel are sequentially arranged in the first direction.

In some embodiments, in the pixel, a size of the first sub-pixel in a second direction is less than a size of any one of the second sub-pixel and the third sub-pixel in the second direction;

a size of the first sub-pixel in the first direction is less than a size of any one of the second sub-pixel and the third sub-pixel in the first direction; and the first direction is perpendicular to the second direction.

In some embodiments, an orthographic projection of the first conductive layer on the base substrate is in an orthographic projection of a spacer region between at least a part of pixels adjacent to each other in the first direction on the base substrate.

In some embodiments, a size of the first conductive layer in the first direction is less than the first distance or the second distance; and a size of the first conductive layer in the second direction is less than a size of the first sub-pixel in the second direction.

In some embodiments, any two adjacent rows of pixels arranged in the second direction are mirror-symmetrical;

or any two adjacent columns of pixels arranged in the first direction are mirror-symmetrical.

In some embodiments, in the array of the plurality of pixels, each row of pixels is arranged in the second direction;

the second sub-pixels in each row of pixels are arranged in the second direction;

the third sub-pixels in each row of pixels are arranged in the second direction; and the first sub-pixels in each row of pixels are arranged in the second direction.

In some embodiments, in the array of the plurality of pixels, each row of pixels is arranged in the second direction; and the first sub-pixels in a $(2n+1)^{th}$ row and a $(2n+2)^{th}$ row of pixels are arranged in the second direction, where n is an integer, n=0, 1, 2 . . . .

In some embodiments, the first sub-pixel is a blue sub-pixel; the second sub-pixel is a red sub-pixel; and the third sub-pixel is a green sub-pixel;

or the first sub-pixel is a blue sub-pixel; the second sub-pixel is a green sub-pixel; and the third sub-pixel is a red sub-pixel.

In some embodiments, the first via is formed in the insulating layer, and configured to connect the anode of each of the first sub-pixel, the second sub-pixel and the third sub-pixel to the first electrode of the driving transistor in a respective one of plurality of pixel circuits.

In some embodiments, the insulating layer is further provided with a second via formed for connecting the first conductive layer to the second conductive layer; and an orthographic projection of the second via on the base substrate is between orthographic projections of two pixels adjacent to each other in the second direction on the base substrate.

In some embodiments, each of the first distance and the second distance in the pixel is in a range from 7 μm to 25 μm.

In some embodiments, orthographic projections of the first via and the second via on the first direction do not overlap with each other.

In some embodiments, orthographic projections of the first via and the second via on the first direction at least partially overlap with each other.

In some embodiments, the display substrate further includes a pixel defining layer on a side of the insulating layer away from the base substrate, each of the first sub-pixel, the second sub-pixel and the third sub-pixel is in a region defined by the pixel defining layer;

each of the first sub-pixel, the second sub-pixel and the third sub-pixel includes a light-emitting functional layer and a cathode; the light-emitting functional layer and the cathode are sequentially arranged away from the anode; and orthographic projections of the light-emitting functional layer and the cathode on the base substrate at least partially overlap the orthographic projection of the anode on the base substrate;

the pixel defining layer has an opening in a region corresponding to the first conductive layer; the light-emitting functional layer and the cathode further extend into the opening, and portions of the light-emitting functional layer and the cathode inside the opening are disconnected from portions of the light-emitting functional layer and the cathode outside the opening, at an edge of the opening; and the portion of the cathode outside the opening covers a broken edge of the light-emitting functional layer at the edge of the opening, and the portion of the cathode outside the opening further extends to be in contact with at least a part of an edge end face of the first conductive layer.

In some embodiments, the first conductive layer includes a first sub-layer, a second sub-layer and a third sub-layer sequentially stacked in a direction away from the base substrate;

a shape of a cross section of the first conductive layer, which is perpendicular to the base substrate, includes a shape of "H" rotated by 90 degrees or a shape of an inverted trapezoid; and the portion of the cathode outside the opening is at least in contact with edge end faces of the second sub-layer and the third sub-layer.

In some embodiments, in the pixel, a ratio of aperture ratios of the second sub-pixel, the third sub-pixel and the first sub-pixel is in a range from 2:2:1 to 3:2:1.

In some embodiments, in the pixel, shapes of orthographic projections of the second sub-pixel, the third sub-pixel and the first sub-pixel on the base substrate each include a rectangle.

In some embodiments, each of the first sub-pixel, the second sub-pixel and the third sub-pixel further includes a color conversion layer on a side of the cathode away from the light-emitting functional layer;

the light-emitting functional layer emits blue light; and the color conversion layer is configured to perform a color conversion of the blue light.

In some embodiments, the color conversion layer includes a first color conversion unit, a second color conversion unit, and a first transmission unit;

an orthographic projection of the first color conversion unit on the base substrate covers the orthographic projection of the second sub-pixel on the base substrate;

an orthographic projection of the second color conversion unit on the base substrate covers the orthographic projection of the third sub-pixel on the base substrate; and an orthographic projection of the first transmission unit on the base substrate covers the orthographic projection of the first sub-pixel on the base substrate.

In some embodiments, the display substrate further includes a bank and a first black matrix, wherein the bank and the first black matrix are on a side of the pixel defining layer away from the base substrate, and the first black matrix and the bank are sequentially arranged away from the pixel defining layer; and each of orthographic projections of the bank and the first black matrix on the base substrate at least partially overlaps an orthographic projection of the pixel defining layer on the base substrate.

In some embodiments, each of the first sub-pixel, the second sub-pixel and the third sub-pixel further includes a color filter layer on a side of the color conversion layer away from the base substrate;

the color filter layer includes a first color filter, a second color filter and a third color filter;

an orthographic projection of the first color filter on the base substrate is within the orthographic projection of the first color conversion unit on the base substrate;

an orthographic projection of the second color filter on the base substrate is within the orthographic projection of the second color conversion unit on the base substrate; and an orthographic projection of the third color filter on the base substrate is within an orthographic projection of the first transmission unit on the base substrate.

In some embodiments, the display substrate further includes a second black matrix on a side of the bank away from the base substrate; and an orthographic projection of the second black matrix on the base substrate is within the orthographic projection of the first black matrix on the base substrate.

In some embodiments, orthographic projections of the plurality of pixel circuits on the base substrate have an equal area.

In some embodiments, the orthographic projection of each of the first sub-pixel, the second sub-pixel and the third sub-pixel on the base substrate and an orthographic projection of the pixel circuit electrically connected to this sub-pixel on the base substrate are at least partially non-overlapping with each other.

In some embodiments, the display substrate further includes a first encapsulation layer, a second encapsulation layer, and an anti-reflection layer;

the first encapsulation layer is on a side of the cathode away from the base substrate and on a side of the color conversion layer close to the cathode;

the second encapsulation layer is on a side of the color conversion layer away from the base substrate and on a side of the color filter layer close to the color conversion layer; and the anti-reflection layer is on a side of the color filter layer away from the base substrate.

In a second aspect, an embodiment of the present disclosure further provides a display panel, including the above described display substrate.

In a third aspect, an embodiment of the present disclosure further provides a display apparatus, including the above described display panel.

BRIEF DESCRIPTION OF DRAWINGS

The accompanying drawings, which are used to provide a further understanding of the present disclosure and constitute a part of this specification, serve to explain the present disclosure together with the following specific embodiments, but do not constitute a limitation to the present disclosure. The above and other features and advantages will become more apparent to one of ordinary skill in the art by describing detailed exemplary embodiments with reference to the accompanying drawings, in which.

DETAIL DESCRIPTION OF EMBODIMENTS

Figure 1:
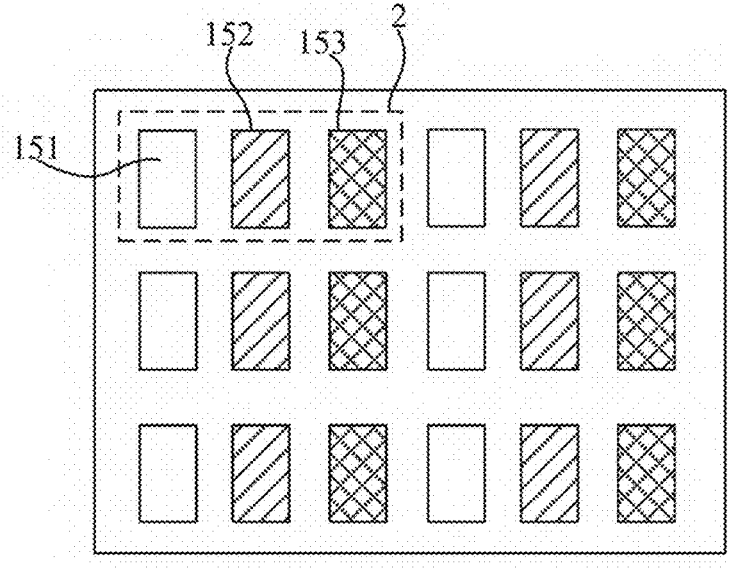
FIG. 1 is a schematic diagram of an arrangement of pixels in an OLED display panel in the related art.

In order to enable one of ordinary skill in the art to better understand the technical solutions of the embodiments of the present disclosure, a display substrate, a display panel and a display apparatus provided in the embodiments of the present disclosure will be further described in detail with reference to the accompanying drawings and the detailed description below.

The embodiments of the present disclosure will be described more fully hereinafter with reference to the accompanying drawings, but the illustrated embodiments may be embodied in different forms and should not be construed as limited to the embodiments set forth herein. Rather, these embodiments are provided so that the present disclosure will be thorough and complete, and will fully convey the scope of the present disclosure to one of ordinary skill in the art.

The embodiments of the present disclosure are not limited to the embodiments shown in the drawings, but include modifications of configurations formed based on a manufacturing process. Accordingly, regions shown in the figures are schematic, and the shapes of the regions shown in the figures are shown as specific shapes, but are not intended to be limiting.

In the related art, Quantum Dots (QDs) are used as a color conversion layer and OLEDs are used as light-emitting elements to make an OLED display panel (namely, a QD-OLED display panel), which can realize high color gamut and have an improved viewing angle color shift. Referring to FIG. 1, a large-sized QD-OLED display panel includes a plurality of pixels 2 arranged in an array, and each of the pixels may include red, green, and blue sub-pixels 151, 152, and 153 arranged adjacent to each other. The pixel 2 includes a light-emitting element and a color conversion layer vertically arranged, wherein the light-emitting element may emit blue light, and the color conversion layer includes a first color conversion unit, a second color conversion unit, and a first transmission unit. Specifically, blue light emitted by the light-emitting element is converted into red light by passing through the first color conversion unit; blue light emitted by the light-emitting element is converted into green light by passing through the second color conversion unit; the first transmission unit may contain scattering particles, and blue light emitted by the light-emitting element may pass through the first transmission unit, and exit still as blue light under an action of the scattering particles. However, the blue sub-pixel 153 may cause a crosstalk to an adjacent sub-pixel emitting light of other color due to a large cell thickness of the OLED display panel, which causes an optical crosstalk between adjacent sub-pixels, resulting in light leakage, and finally resulting in low color gamut of the OLED display panel.

Figure 2A:
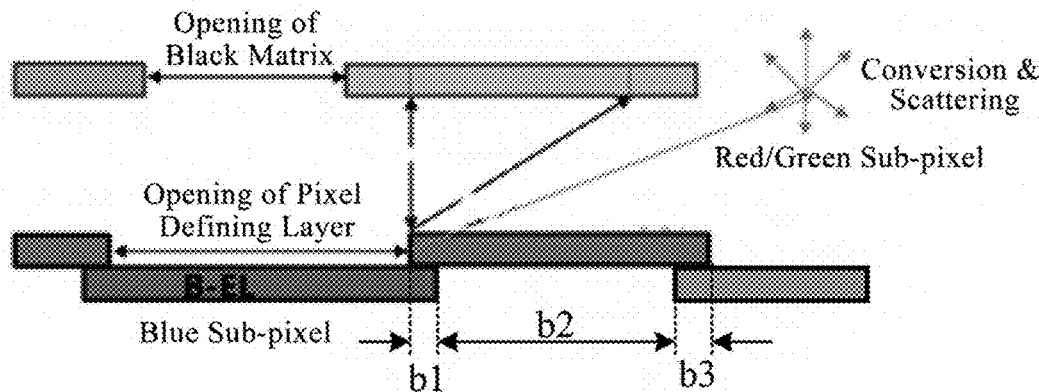
FIG. 2a is a schematic diagram illustrating an optical crosstalk caused by a blue sub-pixel to a red or green sub-pixel surrounding the blue sub-pixel in the related art.
Figure 2B:
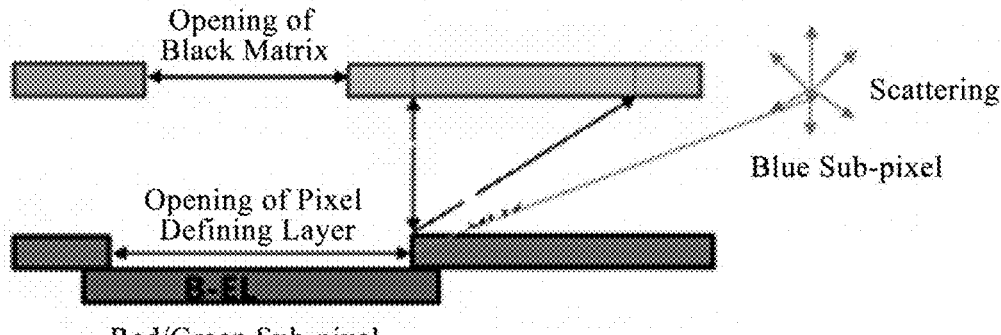
FIG. 2b is a schematic diagram illustrating an optical crosstalk caused by a red or green sub-pixel to a blue sub-pixel surrounding the red or green sub-pixel in the related art.
Figure 2C:
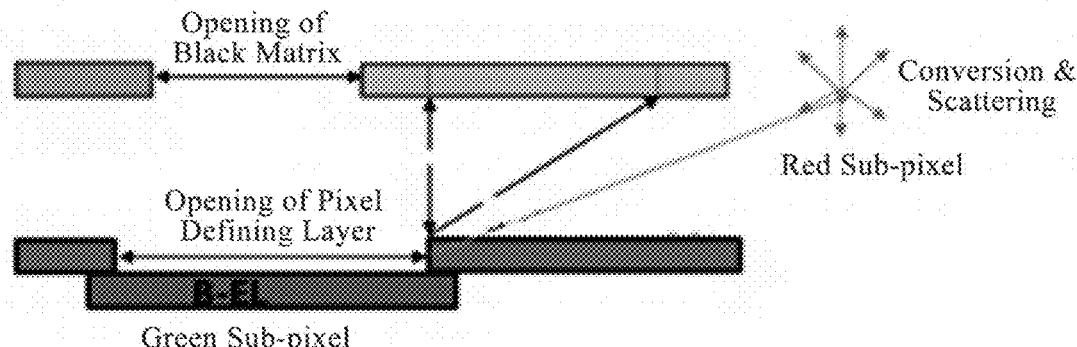
FIG. 2c is a schematic diagram illustrating an optical crosstalk between a red sub-pixel and a green sub-pixel in the related art.

Specifically, an optical crosstalk between adjacent sub-pixels is shown in FIGS. 2a, 2b and 2c. Since the cell thickness of the OLED display panel is larger (the cell thickness is a distance from a surface, of the encapsulation layer for encapsulating the sub-pixels close to a light-emitting layer, to a pixel circuit substrate of the OLED display panel), blue light emitted by the light-emitting element in the blue sub-pixel may irradiate on the quantum dot color conversion units of adjacent red and green sub-pixels, so as to excite a first color conversion unit to emit red light and a second color conversion unit to emit green light, thereby causing an optical crosstalk, as shown in FIG. 2a. In this case, since a part of the blue light emitted by the light-emitting element of the blue sub-pixel is converted by the first transmission unit, there will be an influence of crosstalk light conversion efficiency. Meanwhile, blue light emitted by the light-emitting element in the red sub-pixel and blue light emitted by the light-emitting element in the green sub-pixel may similarly irradiate on the first transmission unit of the blue sub-pixel, and the light scattered by and outgoing from the first transmission unit causes an optical crosstalk, but in this case, there is no influence of crosstalk light conversion efficiency, as shown in FIG. 2b. In addition, the blue light emitted by the light-emitting element in the red sub-pixel and the blue light emitted by the light-emitting element in the green sub-pixel may similarly irradiate on the quantum dot conversion layers in the green sub-pixel and the red sub-pixel, respectively, which causes an optical crosstalk, as shown in FIG. 2c.

In an actual measurement, it is found that the influence of an optical crosstalk between the red sub-pixel and the green sub-pixel is relatively small, and the influence of an optical crosstalk between the blue sub-pixel and a sub-pixel of other color is the most serious, which is prone to cause a phenomenon of a relatively serious light leakage between the sub-pixels, and is not beneficial to improving the color gamut of the OLED display panel, so that the display effect of the OLED display panel is relatively seriously influenced.

Aiming at the problem of a serious optical crosstalk between the blue sub-pixel and a sub-pixel of other color in the QD-OLED display panel, the embodiments of the present disclosure provide the following technical solutions.

In a first aspect, referring to FIGS. 3, 10 to 14, an embodiment of the present disclosure provides a display substrate, including: a base substrate 1; a plurality of pixel circuits arranged on the base substrate 1; and a plurality of pixels 2 arranged in an array and located on a side of the pixel circuits away from the base substrate 1. The pixel 2 includes a first sub-pixel 21, a second sub-pixel 220, and a third sub-pixel 221; orthographic projections of the first sub-pixel 21, the second sub-pixel 220 and the third sub-pixel 221 on the base substrate 1 do not overlap with each other; the first sub-pixel 21, the second sub-pixel 220 and the third sub-pixel 221 are electrically connected to the pixel circuits in a one-to-one correspondence; the first sub-pixel 21 and the second sub-pixel 220 are separated from each other by a first distance in a first direction Y, and a first via 41 is arranged in the first distance; the first sub-pixel 21 and the third sub-pixel 221 are separated from each other by a second distance in the first direction Y, and a first via 41 is arranged in the second distance; the second sub-pixel 220 and the third sub-pixel 221 are separated from each other by a third distance in the first direction Y.

Figure 3:
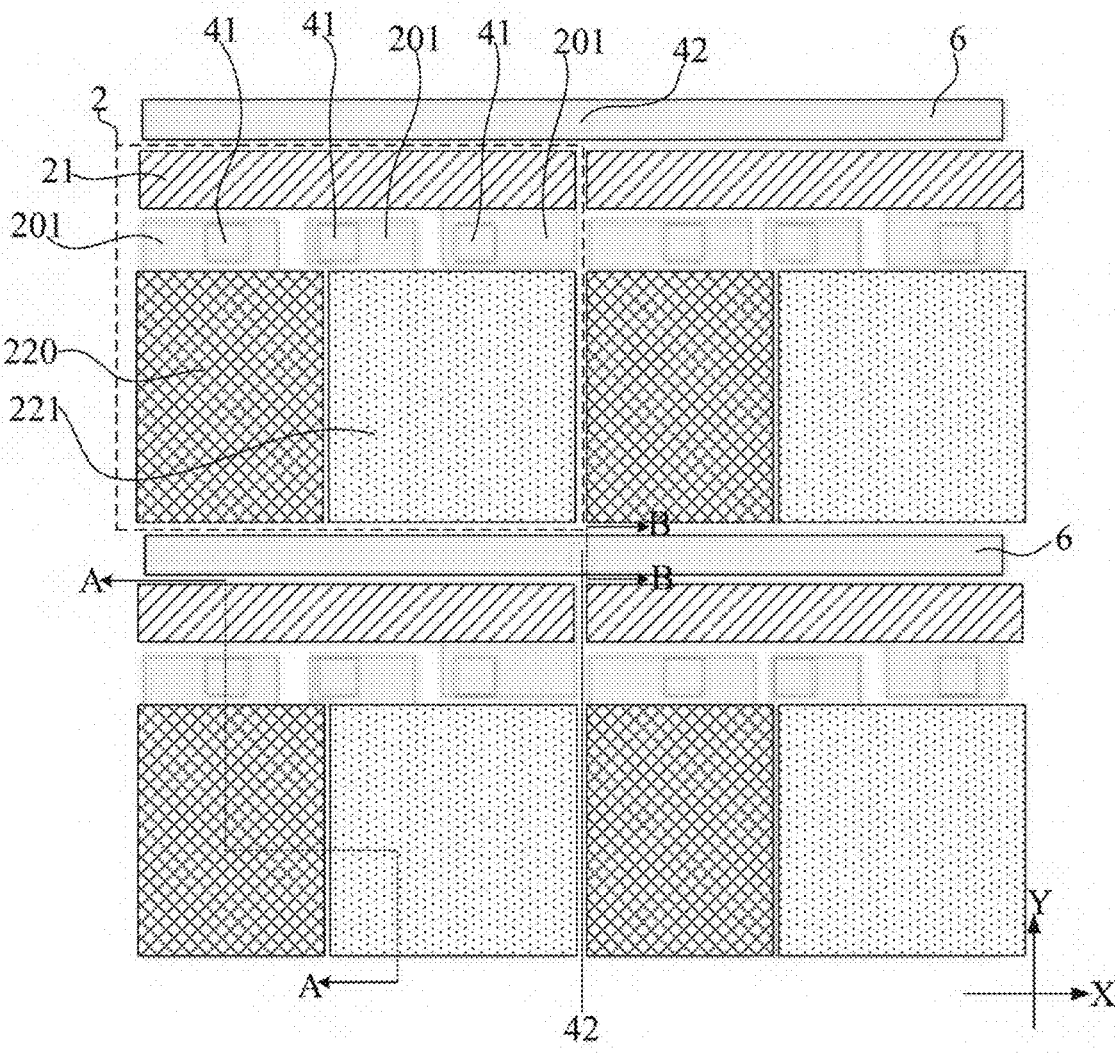
FIG. 3 is a schematic diagram of an arrangement of pixels in a display substrate according to an embodiment of the present disclosure.
Figure 4:
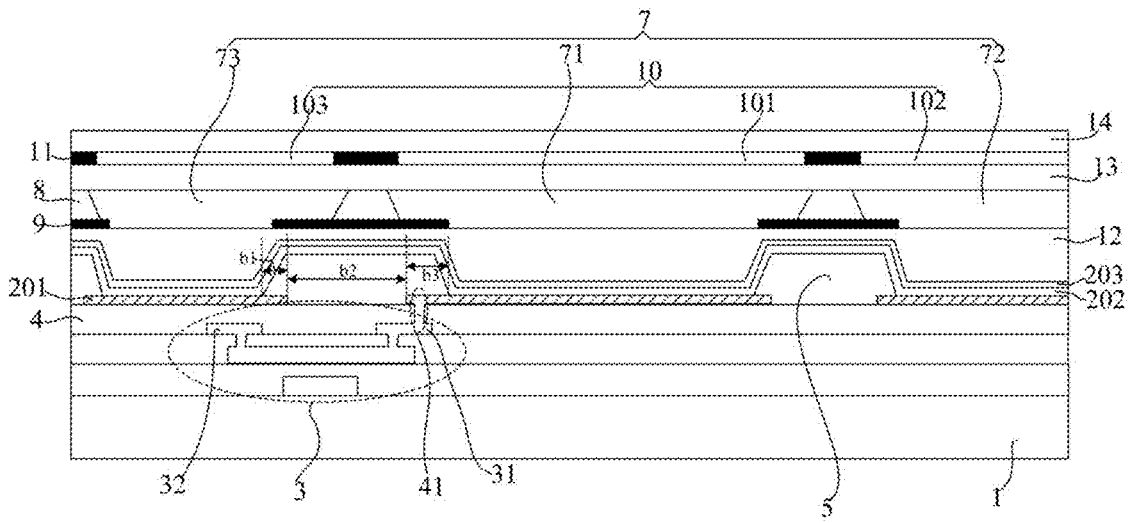
FIG. 4 is a sectional view of a structure taken along a section line AA in FIG. 3.

In some embodiments, referring to FIGS. 3 and 4, the pixel circuit includes a driving transistor 3 and an insulating layer 4; the first sub-pixel 21, the second sub-pixel 220, and the third sub-pixel 221 each include an anode 201; the driving transistor 3, the insulating layer 4 and the anode 201 are sequentially arranged away from the base substrate 1. The first vias 41 are formed in the insulating layer 4 for connecting the anodes 201 of the first sub-pixel 21, the second sub-pixel 220 and the third sub-pixel 221 to first electrodes of the driving transistors 3 in the corresponding pixel circuits, respectively.

Figure 5:
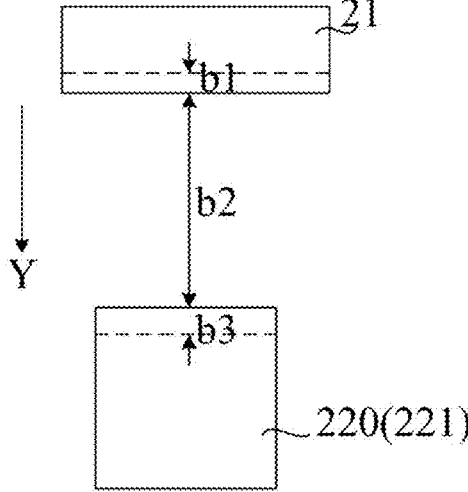
FIG. 5 is a schematic diagram illustrating a distance between a first sub-pixel and a second sub-pixel before improvement.
Figures 6, 7:
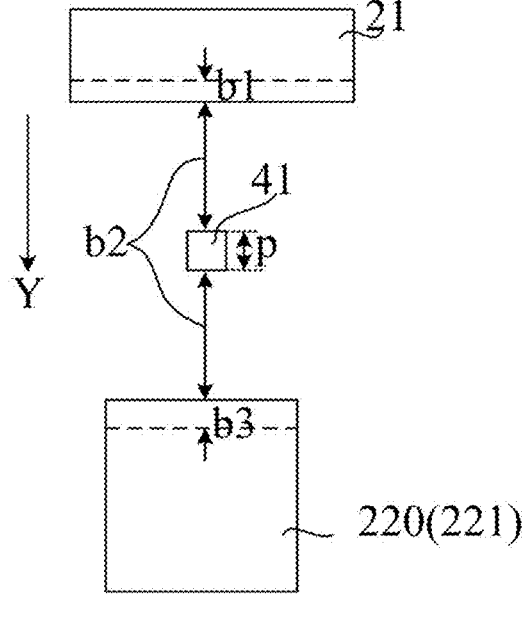
FIG. 6 is a schematic diagram illustrating a distance between the first sub-pixel and the second sub-pixel after the improvement.
FIG. 7 is a sectional view of a structure taken along a section line BB in FIG. 3.

In some embodiments, with the first vias 41 in the first and second distances, the first and second distances may be increased from about 10 μm in the related art to 15 μm to 25 μm, respectively; therefore, an optical crosstalk between the first sub-pixel 21 and the second sub-pixel 220 and an optical crosstalk between the first sub-pixel 21 and the third sub-pixel 221 may be greatly eliminated or avoided, the phenomenon of light leakage between the first sub-pixel 21 and the second sub-pixel 220 and light leakage between the first sub-pixel 21 and the third sub-pixel 221 may be greatly eliminated or avoided, which is beneficial to improving the color gamut of the display substrate and finally improving the display effect of the display substrate. Referring to FIGS. 5 and 2a, before improvement, a distance between the first sub-pixel 21 and the second sub-pixel 220/the third sub-pixel 221 is a distance between the adjacent edges of the first sub-pixel 21 and the second sub-pixel 220/the third sub-pixel 221, which are adjacent to each other. For example, the distance between the first sub-pixel 21 and the second sub-pixel 220/the third sub-pixel 221 is a sum of a size b1, a size b2 and a size b3 in the first direction Y, wherein the size b1 is a size of an overlapping region between orthographic projections of the anode of the first sub-pixel 21 and the pixel defining layer between the adjacent first sub-pixel 21 and second sub-pixel 220/third sub-pixel 221, the size b2 is a size of a portion of the pixel defining layer non-overlapping with the anode of the adjacent first sub-pixel 21 and the anode of the adjacent second sub-pixel 220/third sub-pixel 221, and the size b3 is a size of an overlapping region between orthographic projections of the anode of the second sub-pixel 220/the third sub-pixel 221 and the pixel defining layer between the adjacent first sub-pixel 21 and second sub-pixel 220/third sub-pixel 221. For example, b1+b2+b3=(3.5+4+3.5) μm=11 μm. Referring to FIGS. 6 and 4, after the improvement, the distance between the first sub-pixel 21 and the second sub-pixel 220/the third sub-pixel 221 is the distance between the adjacent edges of the first sub-pixel 21 and the second sub-pixel 220/the third sub-pixel 221, which are adjacent to each other, in the first direction Y, plus a size p of the first via 41 in the first direction Y. For example, the first via 41 is a square via of 6 μm×6 μm, the size p of the first via 41 in the first direction Y is 6 μm; the distance between the first sub-pixel 21 and the second sub-pixel 220/the third sub-pixel 221 after the improvement is: b1+b2+b3+p=(3.5+4+3.5+6) μm=17 μm.

In this embodiment, under the condition that the cell thickness of the display panel is not changed, the arrangement position of the pixel circuit is kept unchanged, and the arrangement position of the sub-pixels is changed, so that the first via 41, at least a part of which is located in a region where the sub-pixels are located in the related art, are completely located in a region of the first distance between the first sub-pixel 21 and the second sub-pixel 220 and a region of the second distance between the first sub-pixel 21 and the third sub-pixel 221. Compared with the arrangement manner of the sub-pixels in the related art, the first distance between the first sub-pixel 21 and the second sub-pixel 220) and the second distance between the first sub-pixel 21 and the third sub-pixel 221 may be increased, so that an optical crosstalk between the first sub-pixel 21 and the second sub-pixel 220 and an optical crosstalk between the first sub-pixel 21 and the third sub-pixel 221 may be greatly eliminated or avoided, and further the phenomenon of light leakage between the first sub-pixel 21 and the second sub-pixel 220 and light leakage between the first sub-pixel 21 and the third sub-pixel 221 may be greatly eliminated or avoided, which is beneficial to improving the color gamut of the display substrate and finally improving the display effect of the display substrate.

In some embodiments, referring to FIGS. 3, 4 and 7, the pixel circuit further includes an auxiliary electrode 6; the auxiliary electrode 6 includes a first conductive layer 61, the first conductive layer 61 is in a same layer as the anode 201, and an orthographic projection of the first conductive layer 61 on the base substrate 1 and an orthographic projection of the anode 201 on the base substrate 1 do not overlap with each other; the auxiliary electrode 6 further includes a second conductive layer 62, the second conductive layer 62 is in a same layer as a first electrode 31 and a second electrode 32 of the driving transistor 3, and an orthographic projection of the second conductive layer 62 on the base substrate 1 and an orthographic projection of the first electrode 31 and the second electrode 32 of the driving transistor 3 on the base substrate 1 do not overlap with each other.

In some embodiments, the insulating layer 4 is further provided with a second via 42 for connecting the first conductive layer 61 to the second conductive layer 62; an orthographic projection of the second via 42 on the base substrate 1 is located between orthographic projections of two pixels 2 adjacent to each other in a second direction X on the base substrate 1.

Compared with the arrangement manner of the sub-pixels in which at least a part of the second via 42 is located in a region where the sub-pixels are located in the related art, the first and second distances may be further increased by making the orthographic projection of the second via 42 on the base substrate 1 be located between the orthographic projections of two pixels 2 adjacent to each other in the second direction X on the base substrate 1, so that an optical crosstalk between the first sub-pixel 21 and the second sub-pixel 220 and an optical crosstalk between the first sub-pixel 21 and the third sub-pixel 221 may be greatly eliminated or avoided, the phenomenon of light leakage between the first sub-pixel 21 and the second sub-pixel 220 and light leakage between the first sub-pixel 21 and third sub-pixel 221 may be greatly eliminated or avoided, which is beneficial to improving the color gamut of the display substrate and finally improving the display effect of the display substrate.

Figures 8, 9:
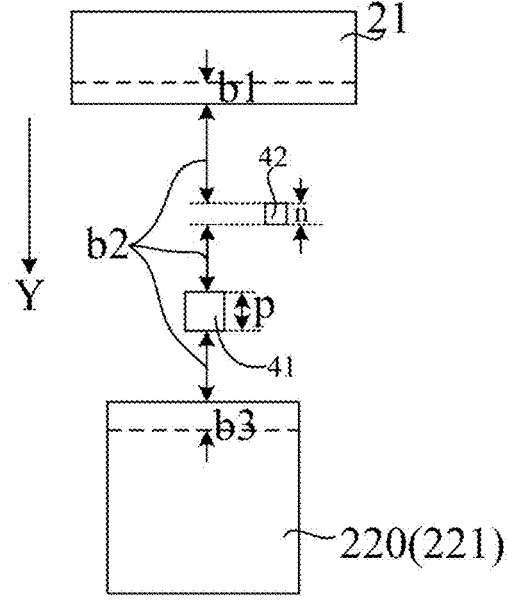
FIG. 8 is a schematic diagram illustrating an arrangement of a first via and a second via in an embodiment of the present disclosure.
FIG. 9 is schematic diagram illustrating another arrangement of the first via and the second via in an embodiment of the present disclosure.

In some embodiments, referring to FIG. 8, orthographic projections of the first via 41 and the second via 42 on the first direction Y do not overlap with each other. Thus, the distance between the first sub-pixel 21 and the second sub-pixel 220 or the third sub-pixel 221, which are adjacent to each other, may be increased by not only the size p of the first via 41 in the first direction Y, but also a size n of the second via 42 in the first direction Y, so that the distance between the first sub-pixel 21 and the second sub-pixel 220) or the third sub-pixel 221, which are adjacent to each other, is further increased, and further, an optical crosstalk between the first sub-pixel 21 and the second sub-pixel 220 and an optical crosstalk between the first sub-pixel 21 and the third sub-pixel 221 may be greatly eliminated or avoided.

In some embodiments, referring to FIG. 9, orthographic projections of the first via 41 and the second via 42 on the first direction Y at least partially overlap with each other. If the orthographic projections of the first via 41 and the second via 42 on the first direction Y partially overlap with each other, the distance between the first sub-pixel 21 and the second sub-pixel 220 or the third sub-pixel 221 is increased; if the orthographic projections of the first via 41 and the second via 42 on the first direction Y completely overlap with each other, and a size of the orthographic projection of the first via 41 on the first direction Y is greater than a size of the orthographic projection of the second via 42 on the first direction Y, the distance between the first sub-pixel 21 and the second sub-pixel 220 or the third sub-pixel 221 is also increased, so that the distance between the first sub-pixel 21 and the second sub-pixel 220 or the third sub-pixel 221, which are adjacent to each other, is further increased, and further, an optical crosstalk between the first sub-pixel 21 and the second sub-pixel 220 and an optical crosstalk between the first sub-pixel 21 and the third sub-pixel 221 may be greatly eliminated or avoided.

In some embodiments, the first distance and the second distance in the pixel 2 are each in a range from 7 μm to 25 μm. Through the above technical solution of disposing the first via 41 and the second via 42 in the first distance and the second distance, respectively, the first distance and the second distance may be increased from a smaller distance before the arrangement of sub-pixels is improved to a larger distance after the arrangement of sub-pixels is improved, so that an optical crosstalk between the first sub-pixel 21 and the second sub-pixel 220 and an optical crosstalk between the first sub-pixel 21 and the third sub-pixel 221 may be greatly eliminated or avoided.

In this embodiment, by adjusting the arrangement of sub-pixels to make the first via 41 and the second via 42 be located in the first distance and the second distance, respectively, distribution positions of the first via 41 and the second via 42 are ensured not to affect an aperture ratio of the sub-pixels and a resolution of the display substrate, that is, the resolution of the display substrate and the aperture ratio of the sub-pixels are not changed due to the change of the distribution positions of the first via 41 and the second via 42.

In some embodiments, referring to FIGS. 4 and 7, the display substrate further includes a pixel defining layer 5 on a side of the insulating layer 4 away from the base substrate 1; each of the first sub-pixel 21, the second sub-pixel 220 and the third sub-pixel 221 is located in a region defined by the pixel defining layer 5; each of the first sub-pixel 21, the second sub-pixel 220, and the third sub-pixel 221 further includes a light-emitting functional layer 202 and a cathode 203; the light-emitting functional layer 202 and the cathode 203 are sequentially arranged away from the anode 201; orthographic projections of the light-emitting functional layer 202 and the cathode 203 on the base substrate 1 at least partially overlap the orthographic projection of the anode 201 on the base substrate 1, and the overlapping portion forms a light-emitting element; the pixel defining layer 5 is formed with an opening in a region corresponding to the first conductive layer 61; the light-emitting functional layer 202 and the cathode 203 further extend into the opening, and the portions of the light-emitting functional layer 202 and the cathode 203 located inside the opening are disconnected from the portions of the light-emitting functional layer 202 and the cathode 203 located outside the opening, at an edge of the opening; the portion of the cathode 203 outside the opening covers a broken edge of the light-emitting functional layer 202 at the edge of the opening, and the portion of the cathode 203 outside the opening further extends to be in contact with at least a part of an edge end face of the first conductive layer 61.

The cathode 203 is in contact with the first conductive layer 61 at the edge of the opening of the pixel defining layer 5, thereby achieving a connection between the cathode 203 and the first conductive layer 61; the first conductive layer 61 is further connected to the second conductive layer 62 through the second via 42, so that the cathode 203, the first conductive layer 61 and the second conductive layer 62 are connected to each other, i.e. the cathode 203 and the auxiliary electrode 6 are connected to each other. In a top emission type OLED display substrate, since there is a requirement for a light transmission of the cathode 203, the cathode 203 is generally has a thin film layer and a large resistance, and the auxiliary electrode 6 may increase an area of a cross section of the cathode 203, so as to reduce the resistance of the cathode 203, further reduce a voltage drop on the cathode 203 and make the voltage of the whole cathode 203 more consistent, thereby improving a display uniformity and a display brightness of the display substrate, and being beneficial to improving the display effect of the display substrate.

In some embodiments, referring to FIG. 7, the first conductive layer 61 includes a first sub-layer 611, a second sub-layer 612, and a third sub-layer 613 stacked sequentially in a direction away from the base substrate 1; a shape of a cross section of the first conductive layer 61 perpendicular to the base substrate 1 includes a shape of "H" rotated by 90 degrees or a shape of an inverted trapezoid; the portion of the cathode 203 outside the opening is at least in contact with edge end faces of the second sub-layer 612 and the third sub-layer 613. If the shape of the cross section of the first conductive layer 61 is a shape of "H" rotated by 90 degrees, referring to FIG. 7, widths of the first sub-layer 611 and the third sub-layer 613 in the cross section are greater than a width of the second sub-layer 612 in the cross section, respectively; if the shape of the cross section of the first conductive layer 61 is a shape of an inverted trapezoid, the width of the third sub-layer 613 in the cross section is greater than the width of the second sub-layer 612 in the cross section, and the width of the second sub-layer 612 in the cross section is greater than the width of the first sub-layer 611 in the cross section. The width of any one sub-layer in the cross section refers to a size of this sub-layer in a direction perpendicular to the direction away from the base substrate 1. The shape of the cross section of the first conductive layer 61 is a result of a conventional manufacturing processes, and is not described in detail herein, as long as the cathode 203 may be ensured to be in good contact with the edge end face of the first conductive layer 61.

In some embodiments, the anode 201 and the first conductive layer 61 have a same lamination structure of the sub-layers. That is, the anode 201 is also formed by stacking three sub-layers, which may reduce a resistance of the anode 201 and improve the display effect. The first sub-layer 611 and the third sub-layer 613 may be made of, for example, indium tin oxide, and the second sub-layer 612 may be made of, for example, aluminum. The materials of the three sub-layers of the anode 201 are the same as the materials of the three sub-layers of the first conductive layer 61, respectively, so that the anode and the first conductive layer 61 may be prepared by a one-patterning process, and the preparation process is simplified. The anode 201 is opaque to light and may reflect light irradiated thereto, thereby implementing a top emission type OLED display substrate. Alternatively, the anode 201 may transmit light, and in this case, a top emission type OLED display substrate may be implemented by providing a reflective layer on a side of the anode 201 close to the base substrate 1 to reflect light irradiated thereto. The top emission type OLED display substrate may achieve a large display aperture ratio.

Figure 10:
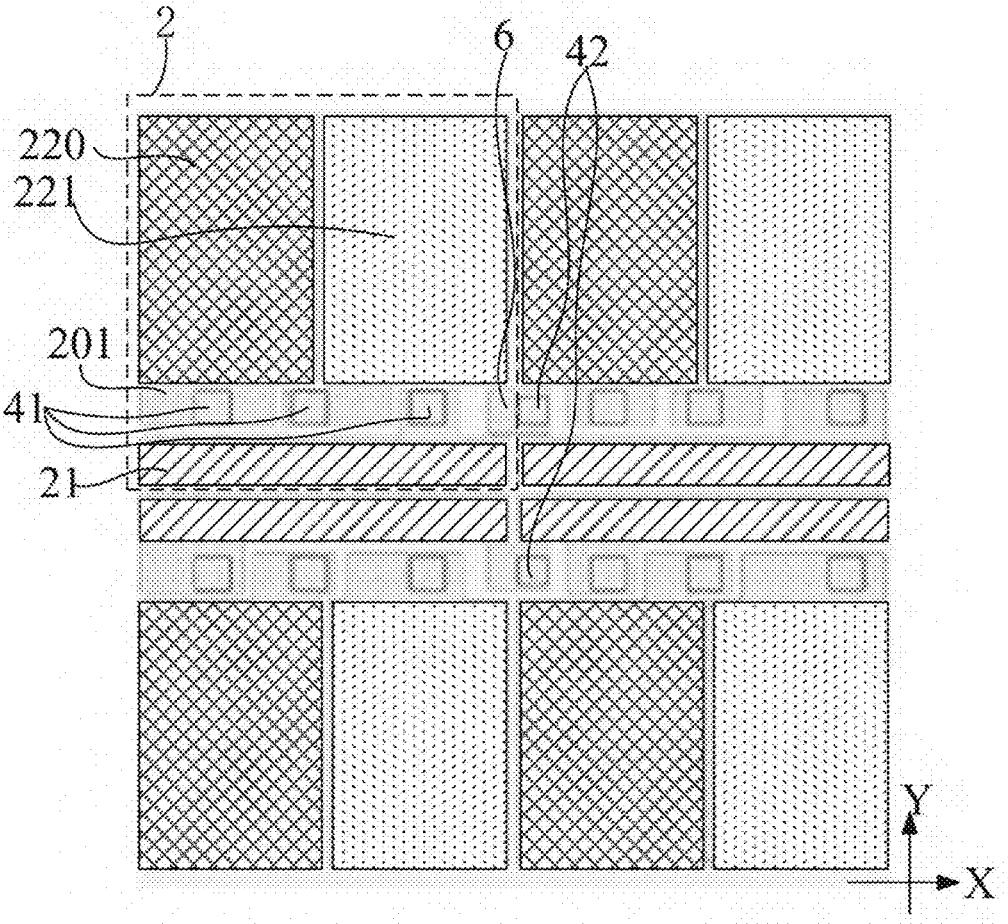
FIG. 10 is a schematic diagram illustrating another arrangement of pixels in a display substrate according to an embodiment of the present disclosure.
Figure 11:
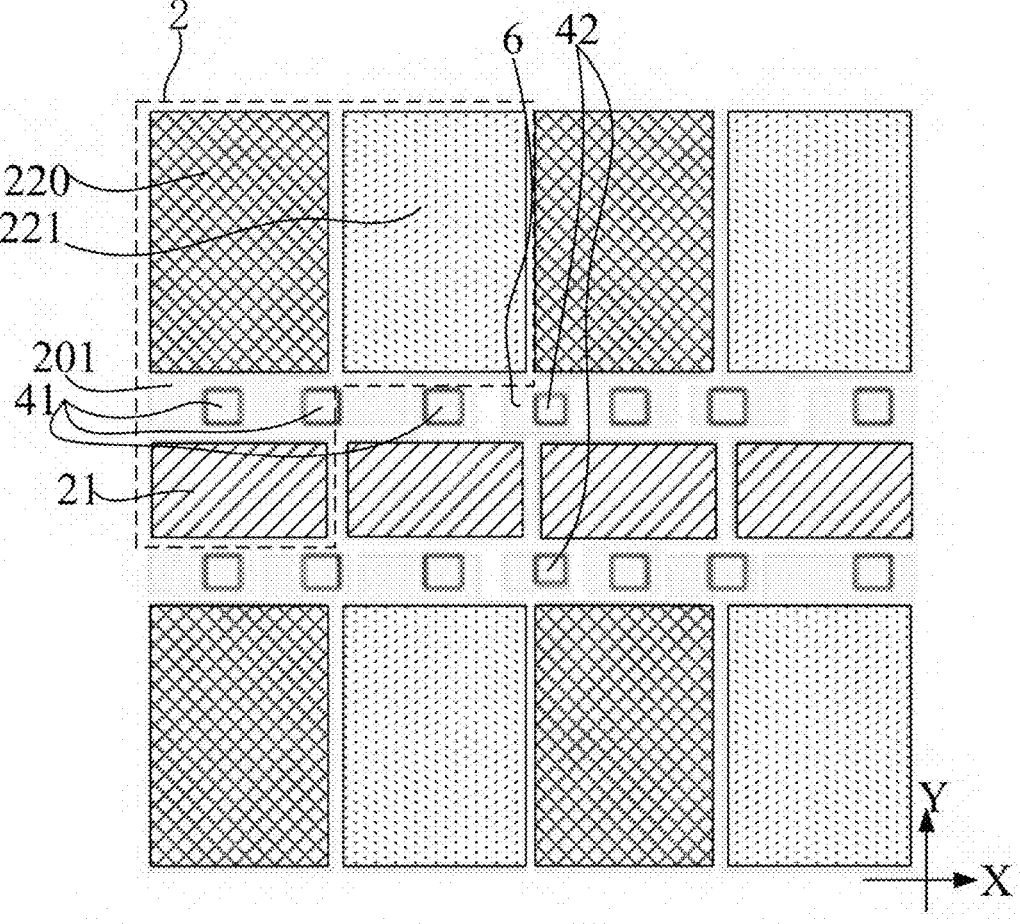
FIG. 11 is a schematic diagram illustrating another arrangement of pixels in a display substrate according to an embodiment of the present disclosure.

In some embodiments, referring to FIGS. 3, 10 and 11, in the pixel 2, the second sub-pixel 220 and the third sub-pixel 221 are on a same side of the first sub-pixel 21; and the second sub-pixel 220 and the third sub-pixel 221 are arranged in a second direction X; the first distance is equal to the second distance; and the third distance is less than the first distance.

In some embodiments, referring to FIG. 3, the first sub-pixel 21 and the third sub-pixel 221 are arranged in the first direction Y; the first direction Y is perpendicular to the second direction X.

In some embodiments, referring to FIG. 3, in the pixel 2, a size of the first sub-pixel 21 in the second direction X is equal to a sum of sizes of the second sub-pixel 220, the third sub-pixel 221 and an interval between the second sub-pixel 220 and the third sub-pixel 221 in the second direction X; a size of the first sub-pixel 21 in the first direction Y is less than a size of any one of the second sub-pixel 220 and the third sub-pixel 221 in the first direction Y.

In a design of an aperture of a sub-pixel, luminous efficiency and lifetime of the sub-pixel need to be considered comprehensively to balance the two. Since the first sub-pixel 21 occupies a small proportion in color mixing, and the first sub-pixel 21 does not involve a matter of excitation conversion of the quantum dot color conversion layer, a relative luminous efficiency thereof is high, a current of the sub-pixel is small, and the lifetime is long; in each of the second sub-pixel 220 and the third sub-pixel 221, the quantum dot color conversion layer is excited to convert blue light into red light and green light, respectively, that is, it is required to make the quantum dot color conversion layer be excited to convert the blue light into light of corresponding colors, so that a relative luminous efficiency thereof is low, a current of the sub-pixel is high, and the lifetime is short. A ratio of aperture ratios of the sub-pixels and a ratio of lifetimes of the sub-pixels may be calculated by the following formula.

$$LTpixel=LTltcx(Jltc/Jpixel)^a \qquad \text{formula (1)}$$

$$Jpixel=Ipixel/(S \times AR) \qquad \text{formula (2)}$$

Where a is an acceleration factor and is a fixed value; LTpixel is the lifetime of the sub-pixel; LTltc is a measurable lifetime of the OLED light-emitting element (including the anode, the light-emitting functional layer and the cathode); Jpixel is a current density of the sub-pixel; Jltc is a given current density of the OLED light-emitting element; Ipixel is a current of the sub-pixel; S is an area of the aperture of the sub-pixel; AR is the aperture ratio of the sub-pixel.

When the data such as color dot efficiency of the sub-pixel is fixed, the lifetime of the sub-pixel depends on the aperture ratio AR of the sub-pixel, and in the OLED display substrate adopting the quantum dot color conversion layer, it may be calculated through the above formulas that an aperture required for the first sub-pixel is minimum. For example, where the current efficiencies of the second sub-pixel 220, the third sub-pixel 221 and the first sub-pixel 21 are 2.3 cd/A, 5.8 cd/A and 1.7 cd/A, respectively, to match white point or color point information of the pixel 2, to which the second sub-pixel 220, the third sub-pixel 221 and the first sub-pixel 21 belong, if the lifetimes of the second sub-pixel 220, the third sub-pixel 221 and the first sub-pixel 21 are in accordance with 1:1:1.5, it may be calculated according to the above formulas (1) and (2) that the ratio of the aperture ratios of the second sub-pixel 220, the third sub-pixel 221 and the first sub-pixel 21 is 2.75:2.4:1, that is, the aperture required for the first sub-pixel 21 is the minimum; an actual ratio of the apertures may be adjusted according to the white point target of the pixel 2 to which the sub-pixels belong and the data of color point and efficiency achieved by the actual process.

In some embodiments, referring to FIGS. 3 and 7, an orthographic projection of the first conductive layer 61 on the base substrate 1 is located in an orthographic projection of a spacer region between at least a part of pixels 2 adjacent to each other in the first direction Y on the base substrate 1.

In some embodiments, referring to FIGS. 3 and 7, a size of the first conductive layer 61 in the second direction X is equal to a sum of sizes of two adjacent pixels 2 in the second direction X and a space between the two adjacent pixels 2 in the second direction X; a size of the first conductive layer 61 in the first direction Y is less than the size of the first sub-pixel 21 in the first direction Y. A size of an area of the orthographic projection of the first conductive layer 61 on the base substrate 1 affects the resistance of the cathode on one hand, and affects the aperture ratio of the sub-pixel and the resolution of the display substrate on the other hand. The distribution of the first conductive layer 61 in this embodiment ensures that the aperture ratio of the sub-pixel and the resolution of the display substrate are not affected. That is, although the first conductive layer 61 occupies a certain region, the resolution of the display substrate and the aperture ratio of the sub-pixel are not changed.

In some embodiments, the sub-pixels may alternatively be arranged as in FIGS. 10 and 11. The arrangement of the sub-pixels in FIGS. 10 and 11 is similar to that in FIG. 3.

Figure 12:
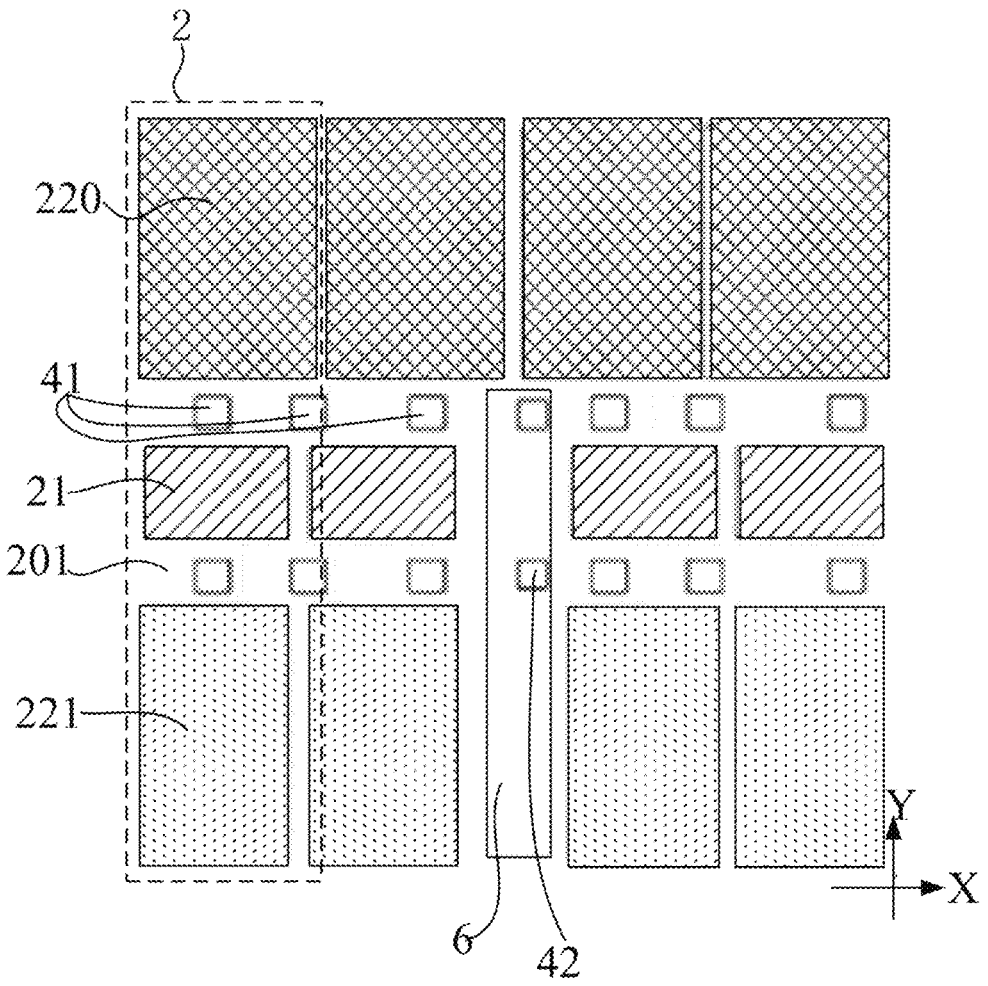
FIG. 12 is a schematic diagram illustrating another arrangement of pixels in a display substrate according to an embodiment of the present disclosure.
Figure 14:
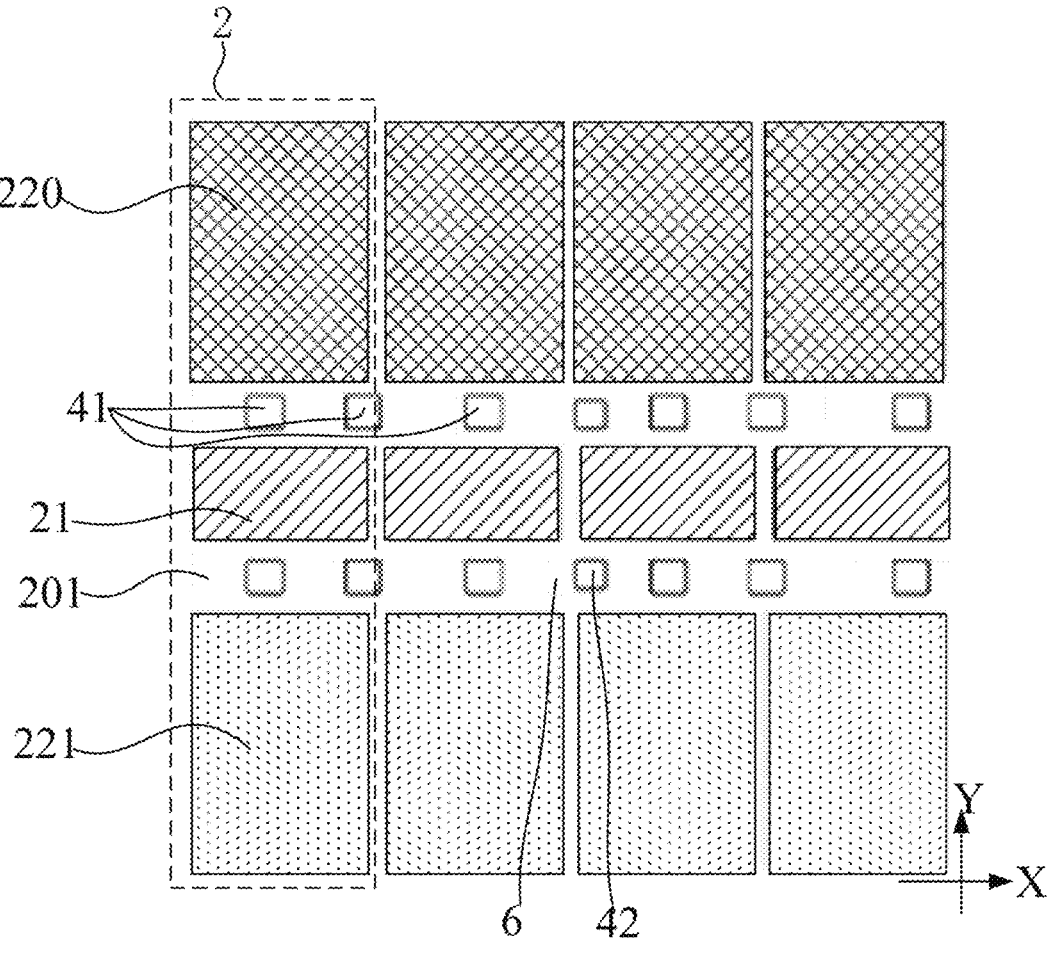
FIG. 14 is a schematic diagram illustrating another arrangement of pixels in a display substrate according to an embodiment of the present disclosure.

In some embodiments, referring to FIGS. 12 and 14, the first distance is equal to the second distance; the third distance is equal to a sum of the first distance, the second distance, and a width of the first sub-pixel 21 in the first direction Y.

In some embodiments, the sub-pixels may alternatively be arranged such that the second sub-pixel 220, the first sub-pixel 21, and the third sub-pixel 221 are sequentially arranged in the first direction Y, as shown in FIGS. 12 and 14.

In some embodiments, referring to FIG. 12, a size of the first conductive layer in the first direction Y is greater than a sum of the sizes of the first sub-pixel 21 and the second sub-pixel 220 in the first direction Y; or, the size of the first conductive layer in the first direction Y is greater than a sum of the sizes of the first sub-pixel 21 and the third sub-pixel 221 in the first direction Y; and a size of the first conductive layer in the second direction X is less than a size of the first sub-pixel 21 in the second direction X.

Figure 13:
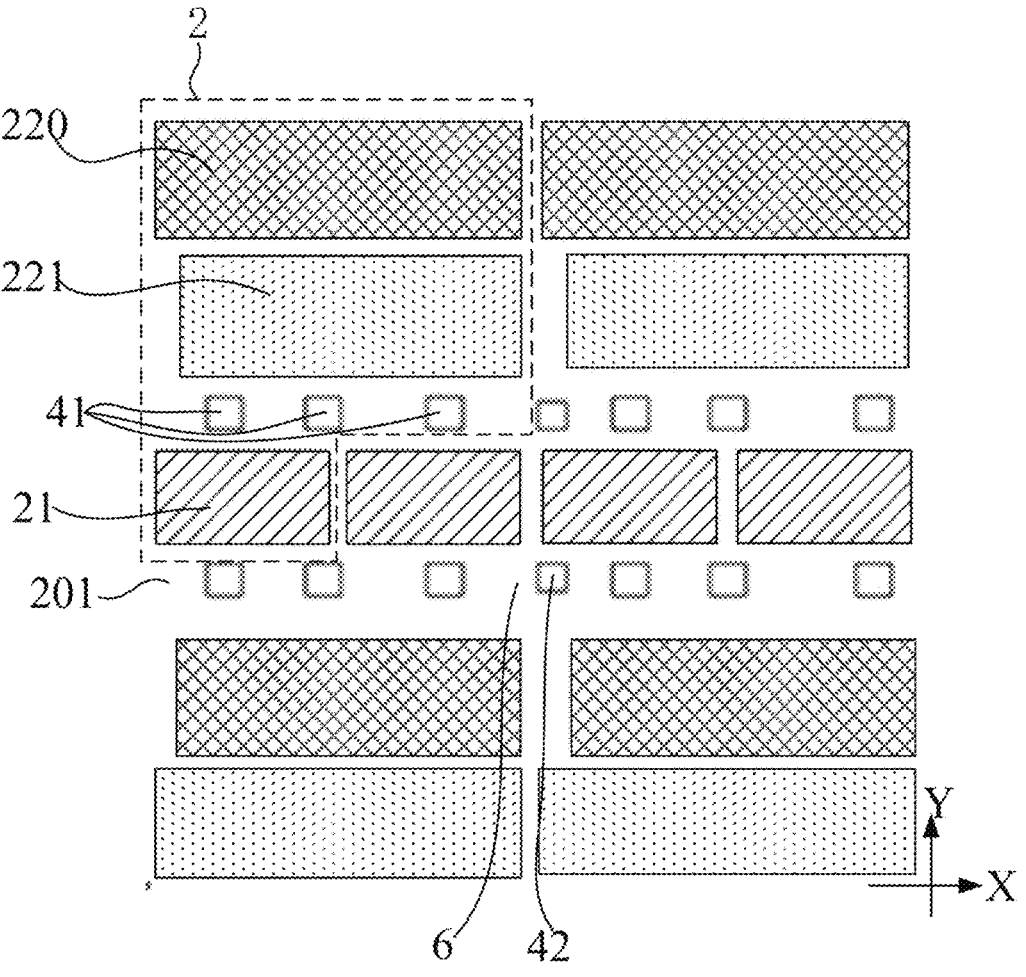
FIG. 13 is a schematic diagram illustrating another arrangement of pixels in a display substrate according to an embodiment of the present disclosure.

In some embodiments, referring to FIG. 13, the first distance is less than the second distance; the second distance is equal to a sum of the first distance, a width of the second sub-pixel 220 in the first direction Y, and the third distance.

In some embodiments, in the pixel 2, the second sub-pixel 220, the third sub-pixel 221 and the first sub-pixel 21 are sequentially arranged in the first direction Y.

In some embodiments, referring to FIGS. 12, 13 and 14, in the pixel 2, a size of the first sub-pixel 21 in the second direction X is less than a size of any one of the second sub-pixel 220 and the third sub-pixel 221 in the second direction X; a size of the first sub-pixel 21 in the first direction Y is less than a size of any one of the second sub-pixel 220 and the third sub-pixel 221 in the first direction Y; and the first direction Y is perpendicular to the second direction X.

In some embodiments, an orthographic projection of the first conductive layer on the base substrate is located in an orthographic projection of a spacer region between at least a part of pixels 2 adjacent to each other in the second direction X on the base substrate.

In some embodiments, referring to FIGS. 10, 13 and 14, a size of the first conductive layer in the first direction Y is less than the first distance or the second distance; a size of the first conductive layer in the second direction X is less than the size of the first sub-pixel 21 in the second direction X.

In some embodiments, referring to FIG. 10, any two adjacent rows of pixels 2 arranged in the second direction X are mirror-symmetrical. Referring to FIGS. 13 and 14, any adjacent two columns of pixels 2 arranged in the first direction Y are mirror-symmetrical.

In some embodiments, referring to FIGS. 12, 13 and 14, in the array of pixels 2, each row of pixels 2 is arranged in the second direction X; the second sub-pixels 220 in each row of pixels 2 are arranged in the second direction X; the third sub-pixels 221 in each row of pixels 2 are arranged in the second direction X; the first sub-pixels 21 in each row of pixels 2 are arranged in the second direction X. Thus, when the first transmission unit corresponding to the first sub-pixel 21 and the color conversion units corresponding to the second sub-pixel 220 and the third sub-pixel 221 are prepared by a subsequent printing or coating process, the printing or coating process may be simpler and easier to implement.

In some embodiments, referring to FIGS. 11 and 13, in the array of pixels 2, each row of pixels 2 are arranged in the second direction X; the first sub-pixels 21 in a $(2n+1)^{th}$ and a $(2n+2)^{th}$ rows of pixels 2 are arranged in the second direction X; wherein n is an integer, n=0, 1, 2 . . . . Therefore, when a scattering particle layer corresponding to the first sub-pixel 21 is prepared by a subsequent printing or coating process, the printing or coating process may be simpler and easier to implement.

In some embodiments, the first sub-pixel 21 is a blue sub-pixel; the second sub-pixel 220 is a red sub-pixel; and the third sub-pixel 221 is a green sub-pixel. In some embodiments, the first sub-pixel 21 is a blue sub-pixel; the second sub-pixel 220 is a green sub-pixel; and the third sub-pixel 221 is a red sub-pixel.

In some embodiments, referring to FIGS. 3, 10, 11, 12, 13, and 14, in the pixel 2, a ratio of aperture ratios of the second sub-pixel 220, the third sub-pixel 221, and the first sub-pixel 21 is in a range from 2:2:1 to 3:2:1. For example, in the pixel 2, the ratio of the aperture ratios of the second sub-pixel 220, the third sub-pixel 221, and the first sub-pixel 21 is 2.75:2.4:1. Thus, according to the foregoing calculation formulas of the aperture ratio of the sub-pixel and the lifetime of the sub-pixel, with the ratio of aperture ratio, a ratio of lifetimes of the second sub-pixel 220, the third sub-pixel 221, and the first sub-pixel 21 1:1:1.5 can be achieved, thereby ensuring that the aperture ratio and the lifetime of the sub-pixel reach a balance, and ensuring that a display lifetime of the display substrate is longest while a display effect of the display substrate is promoted.

In some embodiments, referring to FIGS. 3, 10, 11, 12, 13 and 14, in the pixel 2, shapes of orthographic projections of the second sub-pixel 220, the third sub-pixel 221 and the first sub-pixel 21 on the base substrate 1 each include a rectangle. Thus, when the first transmission unit corresponding to the first sub-pixel 21 and the color conversion units corresponding to the second sub-pixel 220 and the third sub-pixel 221 are prepared by a subsequent printing or coating process, the printing or coating process may be simpler and easier to implement.

In some embodiments, referring to FIG. 4, each of the first sub-pixel 21, the second sub-pixel 220 and the third sub-pixel 221 further includes a color conversion layer 7 on a side of the cathode 203 away from the light-emitting functional layer 202; the light-emitting functional layer 202 emits blue light; the color conversion layer 7 is used for performing a color conversion of the blue light.

In some embodiments, referring to FIG. 4, the color conversion layer 7 includes a first color conversion unit 71, a second color conversion unit 72, and a first transmission unit 73; an orthographic projection of the first color conversion unit 71 on the base substrate 1 covers the orthographic projection of the second sub-pixel 220 on the base substrate 1; an orthographic projection of the second color conversion unit 72 on the base substrate 1 covers the orthographic projection of the third sub-pixel on the base substrate 1; and an orthographic projection of the first transmission unit 73 on the base substrate 1 covers the orthographic projection of the first sub-pixel 21 on the base substrate 1. The first color conversion unit 71 converts the blue light emitted by the light-emitting functional layer 202 in the corresponding sub-pixel into red light by exciting the quantum dots therein; the second color conversion unit 72 converts the blue light emitted by the light-emitting functional layer 202 in the corresponding sub-pixel into green light by exciting the quantum dots therein; the first transmission unit 73 further scatters the blue light emitted by the light-emitting functional layer 202 in the corresponding sub-pixel by the scattering particles therein.

In some embodiments, referring to FIG. 4, the display substrate further includes a bank 8 and a first black matrix 9, the bank 8 and the first black matrix 9 are on a side of the pixel defining layer 5 away from the base substrate 1, and the first black matrix 9 and the bank 8 are sequentially arranged away from the pixel defining layer 5; each of orthographic projections of the bank 8 and the first black matrix 9 on the base substrate 1 at least partially overlaps an orthographic projection of the pixel defining layer 5 on the base substrate 1. The bank 8 serve to separate different portions of the color conversion layer 7 corresponding to the sub-pixels of different colors from each other, so that crosstalk between light of adjacent sub-pixels when the color conversion layer 7 performs color conversion may be avoided. The first black matrix 9 also serves to block light emitted from a sub-pixel from irradiating onto a corresponding portion of the color conversion layer 7 of an adjacent sub-pixel, thereby avoiding crosstalk between light of two adjacent sub-pixels when the color conversion layer 7 performs color conversion.

In some embodiments, referring to FIG. 4, each of the first sub-pixel 21, the second sub-pixel 220, and the third sub-pixel 221 further includes a color filter layer 10 on a side of the color conversion layer 7 away from the base substrate 1; the color filter layer 10 includes a first color filter 101, a second color filter 102 and a third color filter 103; an orthographic projection of the first color filter 101 on the base substrate 1 is within the orthographic projection of the first color conversion unit 71 on the base substrate 1; an orthographic projection of the second color filter 102 on the base substrate 1 is within the orthographic projection of the second color conversion unit 72 on the base substrate 1; an orthographic projection of the third color filter 103 on the base substrate 1 is within the orthographic projection of the first transmission unit 73 on the base substrate 1. The color of the first color filter 101 is the same as the color after conversion of the first color conversion unit 71; the color of the second color filter 102 is the same as the color after conversion of the second color conversion unit 72; the color of the third color filter 103 is the same as the color of light emitted by the light-emitting functional layer of the first sub-pixel 21; and the color filter layer 10 may filter the light which is not converted after the conversion of the color conversion layer 7, so that a purity of the display color of each sub-pixel is further improved, and further, the display effect is improved.

In some embodiments, based on the structure of the display substrate in FIG. 4, a light-emitting principle of each sub-pixel is as follows; a battery or power supply applies a voltage across the anode 201 and the cathode 203 of the sub-pixel; current flows from the cathode 203 to the anode 201, and passes through the light-emitting functional layer 202; the light-emitting functional layer 202 includes an organic molecule emission layer and an organic molecule transport layer; the cathode 203 outputs electrons to the organic molecule emission layer in the light-emitting functional layer 202; the anode 201 absorbs electrons transferred from the organic molecule transport layer in the light-emitting functional layer 202 (here, it may be considered that the anode outputs holes to the organic molecule transport layer, the two descriptions have a same effect); at an interface between the emission layer and the transport layer, electrons are combined with holes; when an electron encounters a hole, the electron fills the hole (the electron falls to a certain energy level in the atom from which an electron was missing); when this occurs, the electrons release energy in a form of photons; the light-emitting functional layer 202 emits light. In this embodiment, the light-emitting functional layer 202 of each sub-pixel emits blue light. In the display substrate of this embodiment, the light-emitting functional layer 202 adopts an organic blue light-emitting material laid in a whole layer, and the size of the pattern of the anode of each sub-pixel determines the size of the area of an aperture of each sub-pixel; after passing through the color conversion layer 7 in the pixel, the blue light is converted into other colors, such as red, green and blue colors; the color conversion layer 7 is made of a quantum dot material, and the quantum dots are semiconductor nano-crystals and may generate pure monochromatic red light, green light and blue light; thereby enabling a color display of the display substrate. The color filter layer 10 is arranged on a side of the color conversion layer 7 away from the base substrate 1, so that the purity of the display color of each sub-pixel may be further improved, and the display effect may be improved.

In some embodiments, referring to FIG. 4, the display substrate further includes a second black matrix 11 on a side of the bank 8 away from the base substrate 1; and an orthographic projection of the second black matrix 11 on the base substrate 1 is within the orthographic projection of the first black matrix 9 on the base substrate 1. The second black matrix 11 separates the portions of the color filter layer 10 with different colors from each other on one hand, and on the other hand may prevent the light emitted by a sub-pixel from irradiating onto a corresponding portion of color filter layer 10 of an adjacent sub-pixel after the light passing through a corresponding portion of color conversion layer 7 of the adjacent sub-pixel, so as to avoid crosstalk between the light of the two adjacent sub-pixels; the orthographic projection of the second black matrix 11 on the base substrate 1 is within the orthographic projection of the first black matrix 9 on the base substrate 1, so that an optical crosstalk between the two adjacent sub-pixels may be better avoided, and the display effect may be improved.

Figure 15A:
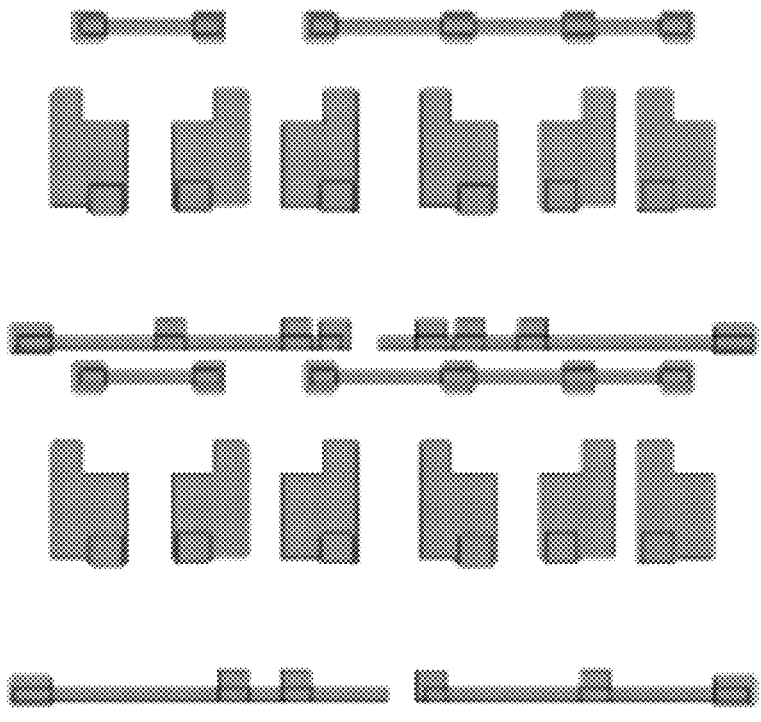
FIG. 15a is a pattern of a conductive layer on a base substrate in a plurality of pixel circuits, including a pattern for forming one plate of a capacitor in a pixel circuit, a pattern of some connecting vias, and a pattern of a signal trace.
Figure 15B:
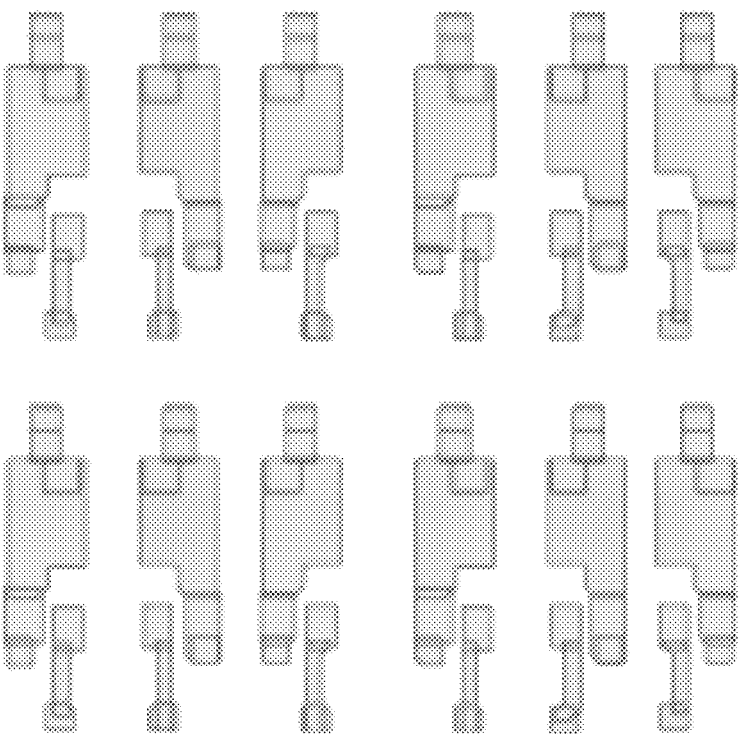
FIG. 15b is a pattern of an active layer of a transistor on a side of the pattern of the conductive layer in FIG. 15a away from the base substrate in the plurality of pixel circuits.
Figure 15C:
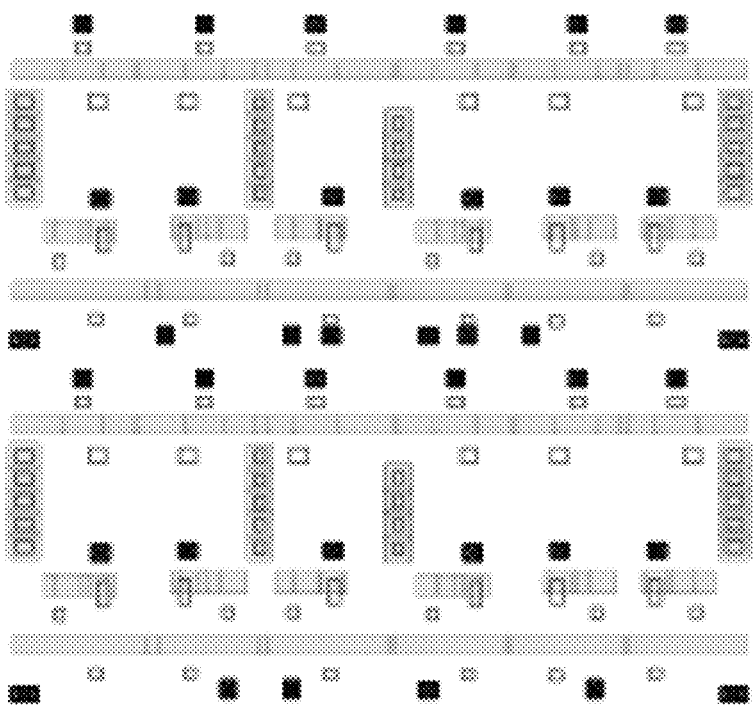
FIG. 15c is a pattern of vias in an insulating layer on a side of the pattern of the active layer away from the base substrate in the plurality of pixel circuits.
Figure 15D:
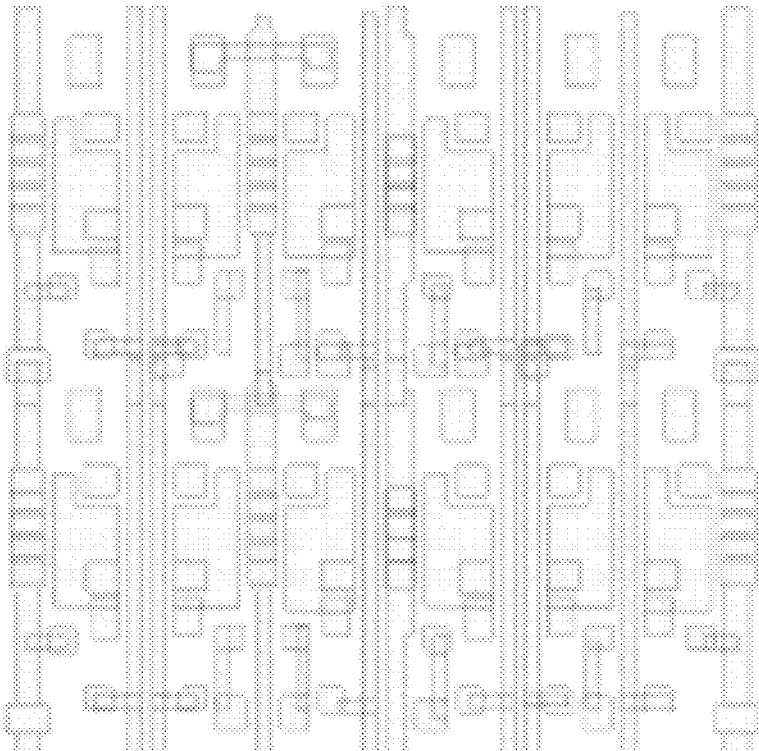
FIG. 15d is a pattern of a source/drain electrode layer in the transistors, a second conductive layer, and other conductive structures on a side of the insulating layer away from the base substrate in the plurality of pixel circuits.
Figure 15E:
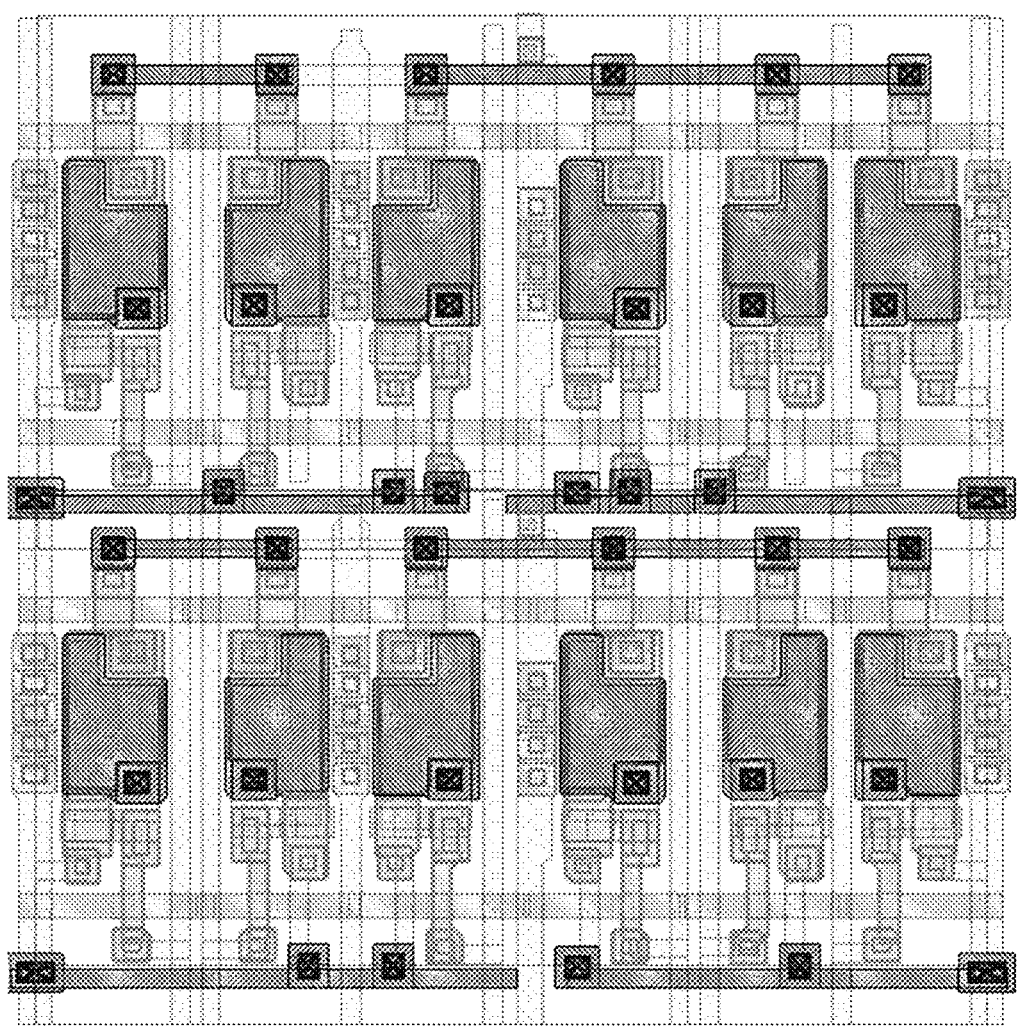
FIG. 15e is a top view of a pattern of the plurality of pixel circuits after the film layers in FIGS. 15a, 15b, 15c, and 15d are sequentially stacked together.

In some embodiments, referring to FIGS. 15a to 15e, the orthographic projections of the plurality of pixel circuits on the base substrate have an equal area. FIG. 15a is a pattern of a conductive layer on a base substrate in the plurality of pixel circuits, the pattern of the conductive layer includes a pattern for forming one plate of a capacitor in a pixel circuit, a pattern of some connecting vias, and a pattern of a signal trace. FIG. 15b is a pattern of an active layer of a transistor on a side of the pattern of the conductive layer of FIG. 15a away from the base substrate in the plurality of pixel circuits. FIG. 15c is a pattern of vias in an insulating layer (e.g., a gate insulating layer, an interlayer dielectric layer, etc.) on a side of the pattern of the active layer away from the base substrate in the plurality of pixel circuits. FIG. 15d is a pattern of a source/drain electrode layer in the transistor, the second conductive layer, and other conductive structures on a side of the insulating layer away from the base substrate in the plurality of pixel circuits. FIG. 15e is a top view of the plurality of pixel circuits after the film layers in FIGS. 15a, 15b, 15c, and 15d are sequentially stacked together. In this embodiment, the design and arrangement of the pixel circuits are not changed.

Figure 16A:
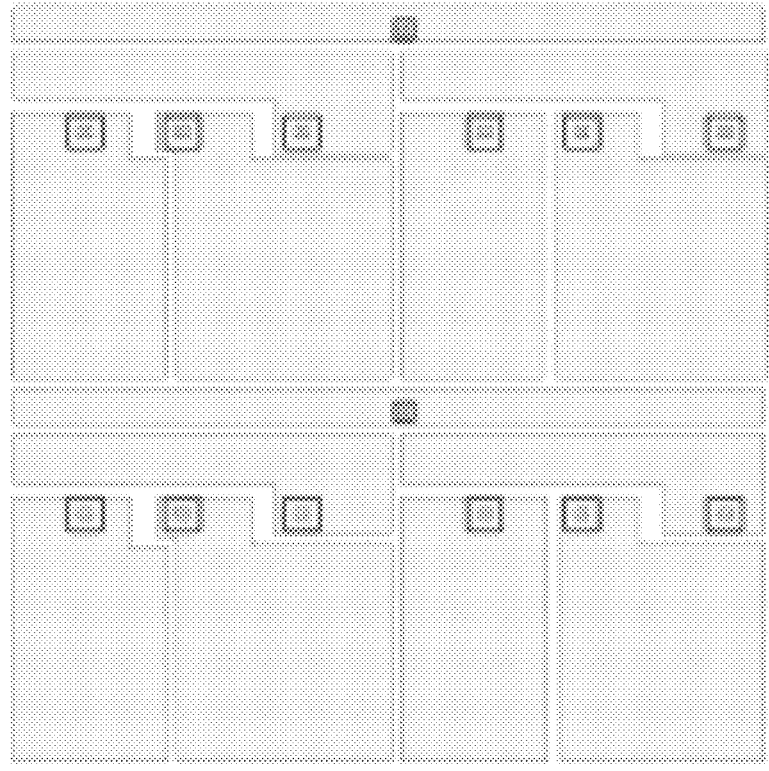
FIG. 16a is a pattern of an anode, a first conductive layer and a via in an insulating layer on a side of the pattern of the source/drain electrode layer in the transistors away from the base substrate in the display substrate.
Figure 16B:
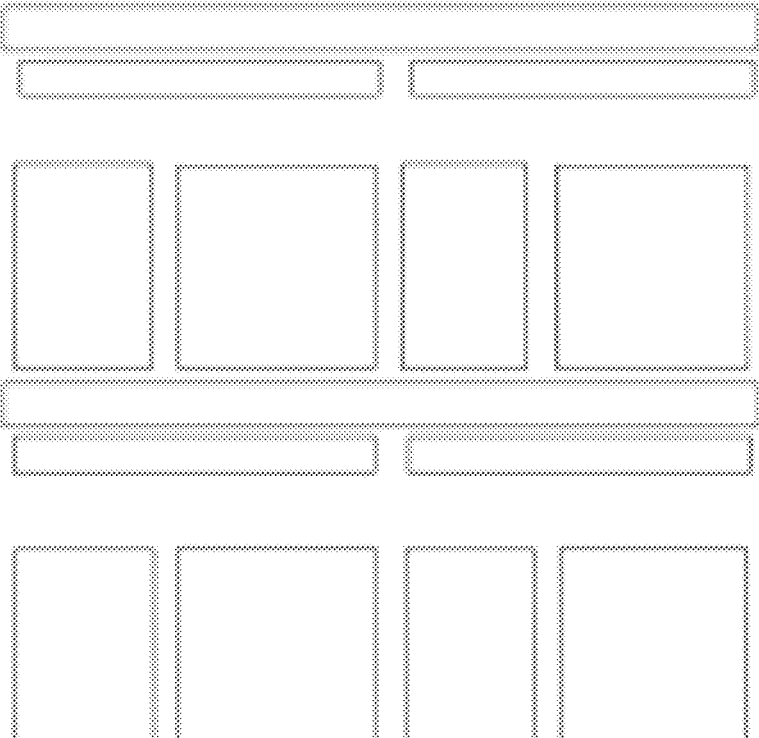
FIG. 16b is a pattern of an opening formed in a pixel defining layer on a side of the anode away from the base substrate in the display substrate.
Figure 16C:
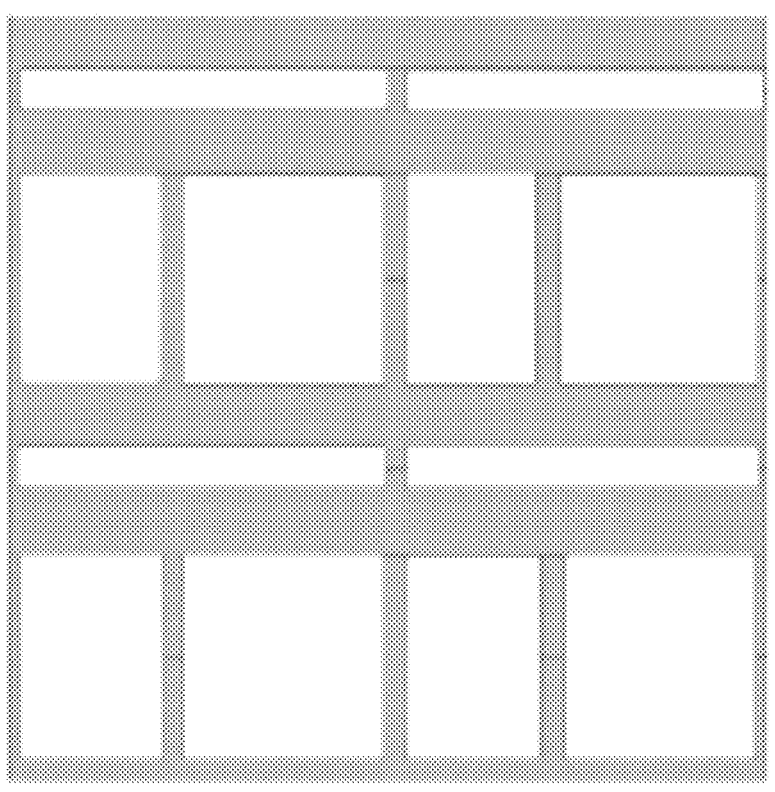
FIG. 16c is a pattern of a bank and a first black matrix on a side of the pixel defining layer away from the base substrate in the display substrate.
Figure 16D:
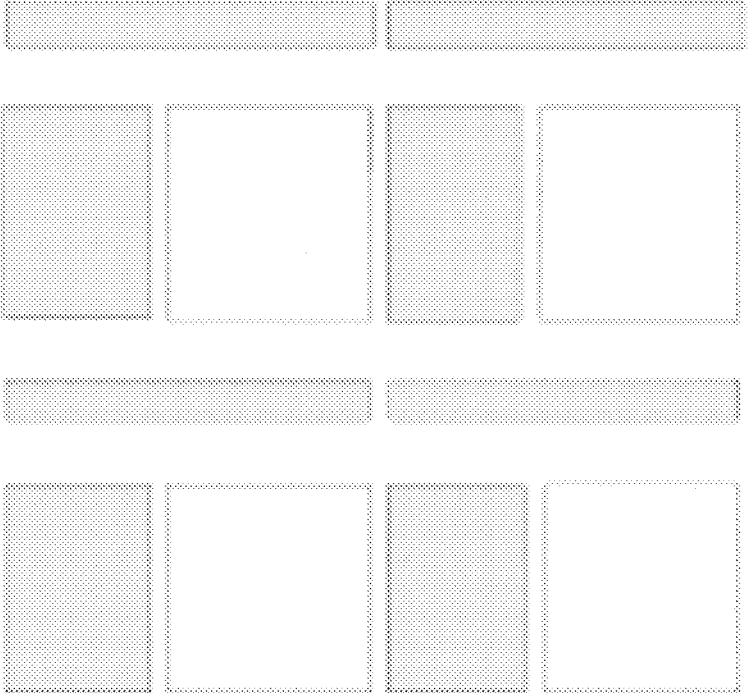
FIG. 16d is a pattern of a color conversion layer in regions separated by the bank in the display substrate.
Figure 16E:
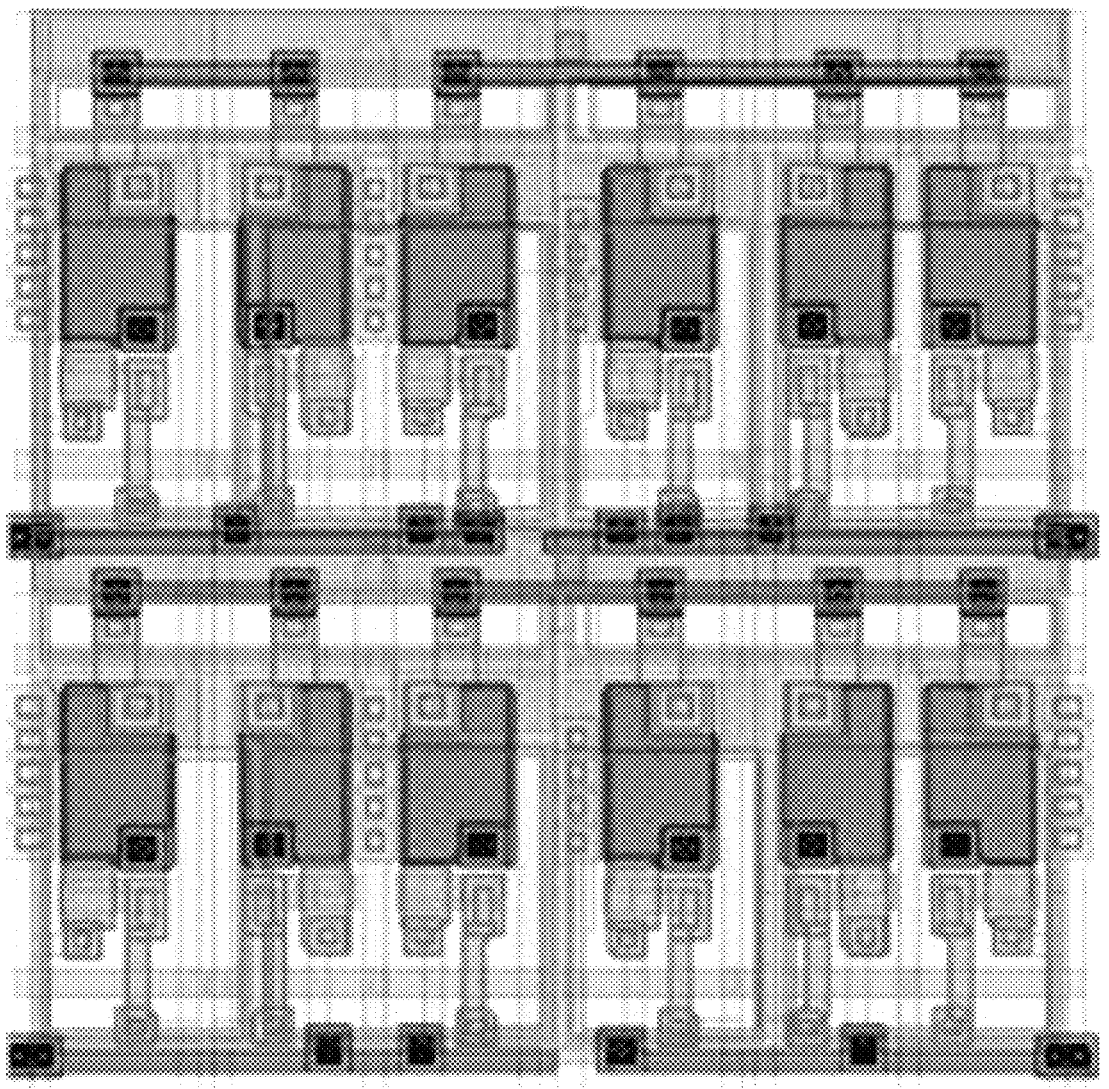
FIG. 16e is a top view of a pattern of the display substrate after the film layers in FIGS. 15a to 15d and FIGS. 16a to 16d are sequentially stacked together.

In some embodiments, referring to FIGS. 16a to 16e, FIG. 16a is a pattern of an anode, a first conductive layer and a via in an insulating layer (e.g., a passivation layer, a planarization layer, etc.) on a side of the pattern of the source/drain electrode layer in the transistor away from the base substrate, in the display substrate. FIG. 16b is a pattern of an opening formed in a pixel defining layer on a side of the anode away from the base substrate in the display substrate, each of orthographic projections of the sub-pixel and the first conductive layer on the base substrate is in an orthographic projection of the opening on the base substrate. FIG. 16c is a pattern of a bank and a first black matrix on a side of the pixel defining layer away from the base substrate in the display substrate. FIG. 16d is a pattern of a color conversion layer in regions divided by the bank in the display substrate. FIG. 16e is a top view of the display substrate after the film layers in FIGS. 15a to 15d and FIGS. 16a to 16d are sequentially stacked together. In this embodiment, the arrangement of the sub-pixels is changed, such that the orthographic projections of the first via 41 and the second via 42 on the base substrate are located in the region between the orthographic projections of the first sub-pixel 21 and the second sub-pixel 22 on the base substrate, thereby eliminating or avoiding an optical crosstalk between the first sub-pixel 21 and the second sub-pixel 22 adjacent to each other. FIGS. 15a to 15d and FIGS. 16a to 16d are patterns of the film layers in the display substrate corresponding to the arrangement of sub-pixels in FIG. 3.

In some embodiments, referring to FIG. 16e, each of the orthographic projections of the first sub-pixel, the second sub-pixel and the third sub-pixel on the base substrate and the orthographic projection of the pixel circuit electrically connected to this sub-pixel on the base substrate are at least partially non-overlapping with each other. In the related art, the orthographic projections of the sub-pixels are in a one-to-one correspondence with the orthographic projections of the pixel circuits electrically connected to the sub-pixels on the base substrate, and overlapping regions between the orthographic projections of the respective sub-pixels and the corresponding pixel circuits are regular and consistent. In this embodiment, the orthographic projections of the sub-pixels are not in a one-to-one correspondence with the orthographic projections of the pixel circuits electrically connected to the sub-pixels on the base substrate, and overlapping regions between the orthographic projections of the respective sub-pixels and the corresponding pixel circuits are irregular and inconsistent, that is, the orthographic projections of the sub-pixels are in a random correspondence with the orthographic projections of the pixel circuits. Thus, on one hand, the arrangement of the sub-pixels is changed to enable the first via 41 and the second via 42 to be located in the regions between the first sub-pixel 21, the second sub-pixel 220 and the third sub-pixel 221, so that the distance between the first sub-pixel 21 and the second sub-pixel 220 and the distance between the first sub-pixel 21 and the third sub-pixel 221 are increased, and further, an optical crosstalk between the first sub-pixel 21 and the second sub-pixel 220 and an optical crosstalk between the first sub-pixel 21 and the third sub-pixel 221 may be eliminated or avoided; on the other hand, a space may be more effectively and reasonably utilized, so that the aperture ratio of the sub-pixels may not be reduced due to changing the arrangement of the sub-pixels, and the display resolution of the display substrate may not be reduced.

Figure 17A:
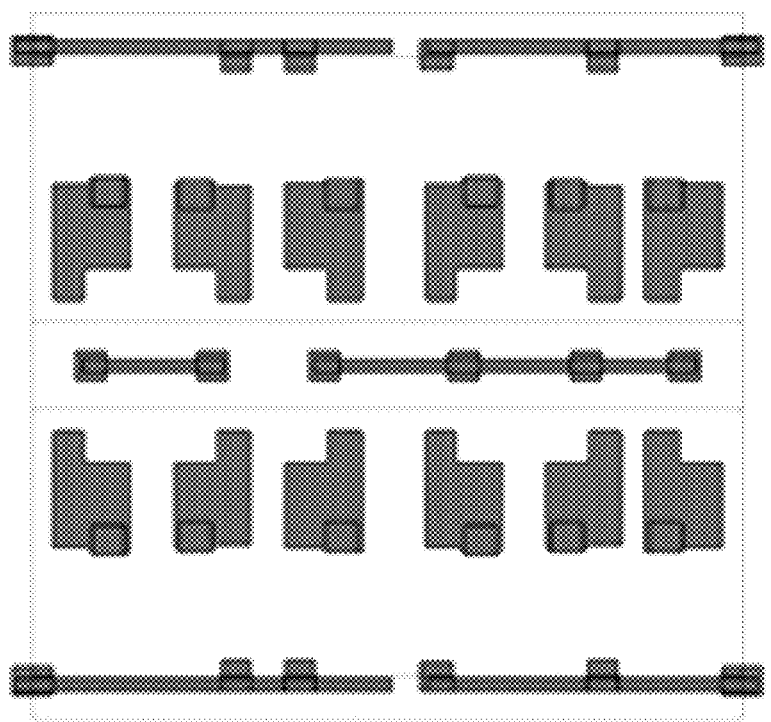
FIG. 17a is a pattern of a conductive layer on a base substrate in a plurality of pixel circuits, including a pattern for forming one plate of a capacitor in a pixel circuit, a pattern of some connecting vias, and a pattern of a signal trace.
Figure 17B:
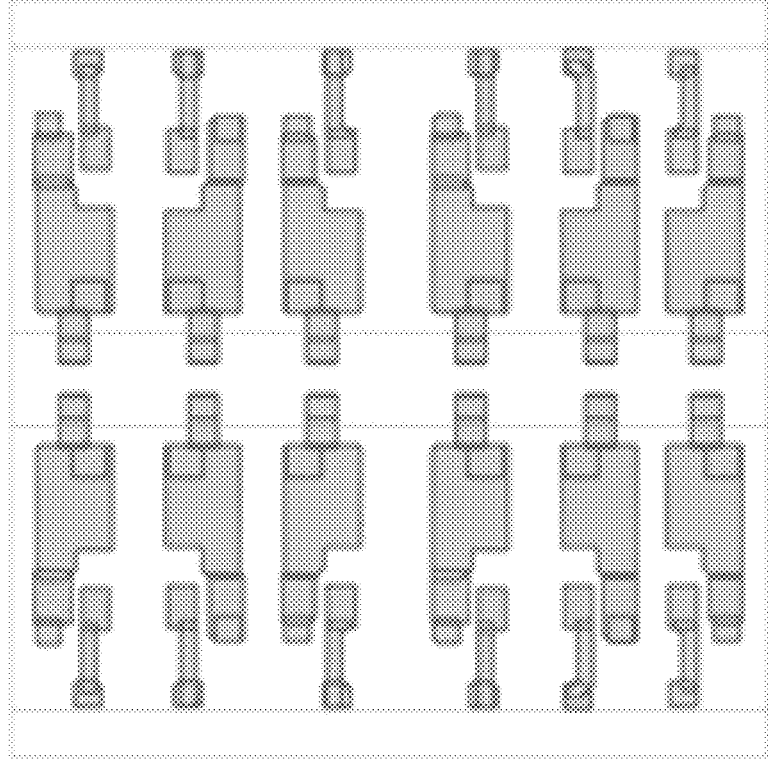
FIG. 17b is a pattern of an active layer of a transistor on a side of the pattern of the conductive layer in FIG. 15a away from the base substrate in the plurality of pixel circuits.
Figure 17C:
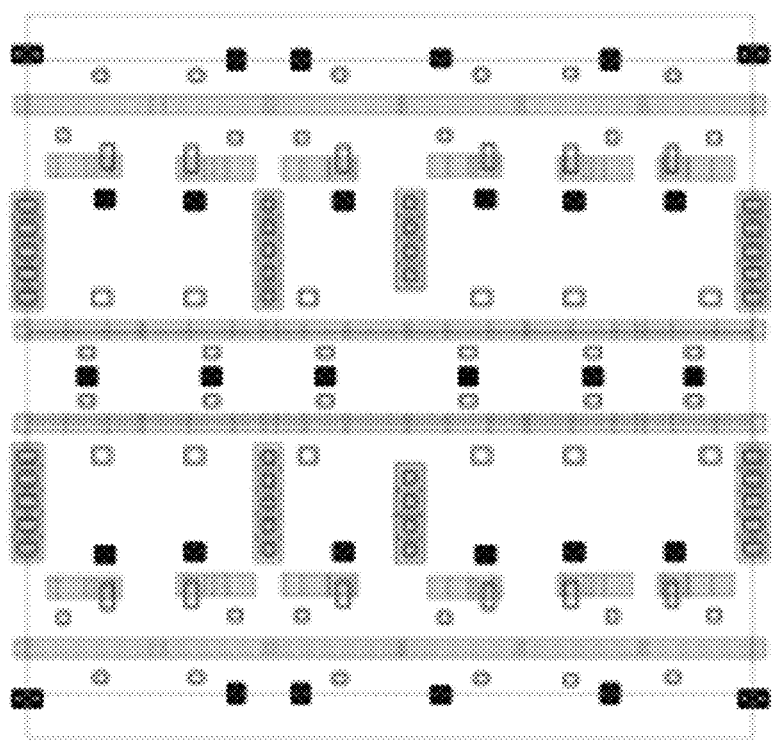
FIG. 17c is a pattern of vias in an insulating layer on a side of the pattern of the active layer away from the base substrate in the plurality of pixel circuits.
Figure 17D:
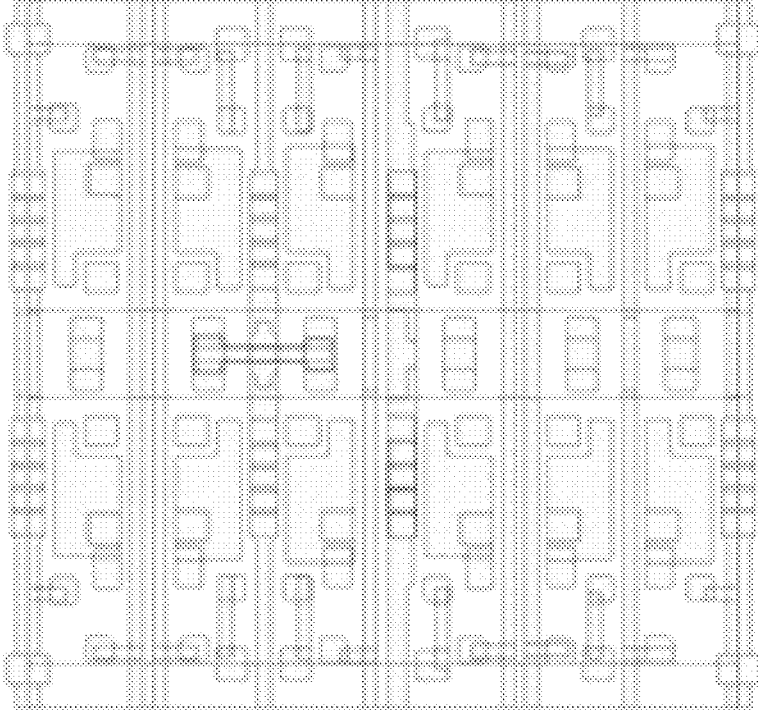
FIG. 17d is a pattern of a source/drain electrode layer in the transistors, a second conductive layer, and other conductive structures on a side of the insulating layer away from the base substrate in the plurality of pixel circuits.

In some embodiments, FIGS. 17a to 17d and FIGS. 18a to 18d are patterns of the film layers in a display substrate corresponding to the arrangement of sub-pixels of FIG. 12. FIG. 17a is a pattern of a conductive layer on a base substrate in a plurality of pixel circuits, the pattern of the conductive layer includes a pattern for forming one plate of a capacitor in the pixel circuit, a pattern of some connecting vias and a pattern of a signal trace. FIG. 17b is a pattern of an active layer of a transistor on a side of the pattern of the conductive layer in FIG. 15a away from the base substrate in the plurality of pixel circuits. FIG. 17c is a pattern of vias in an insulating layer (e.g., a gate insulating layer, an interlayer dielectric layer, etc.) on a side of the pattern of the active layer away from the base substrate in a plurality of pixel circuits. FIG. 17d is a pattern of the source/drain electrode layer in the transistor, a second conductive layer, and other conductive structures on the side of the insulating layer away from the base substrate in the plurality of pixel circuits.

Figure 18A:
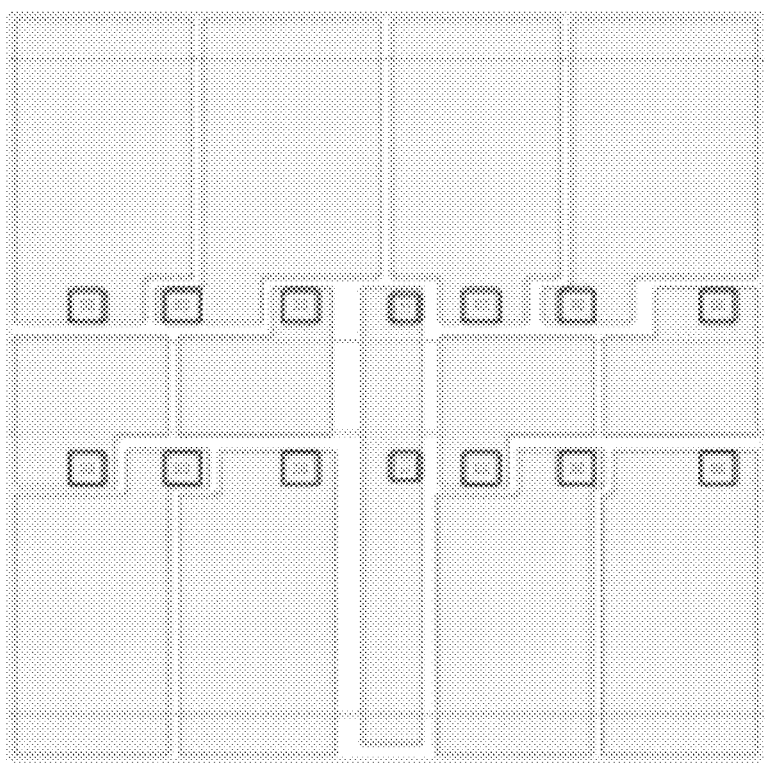
FIG. 18a is a pattern of an anode, a first conductive layer, and a via in an insulating layer on a side of the pattern of the source/drain electrode layer in the transistors away from the base substrate in the display substrate.
Figure 18B:
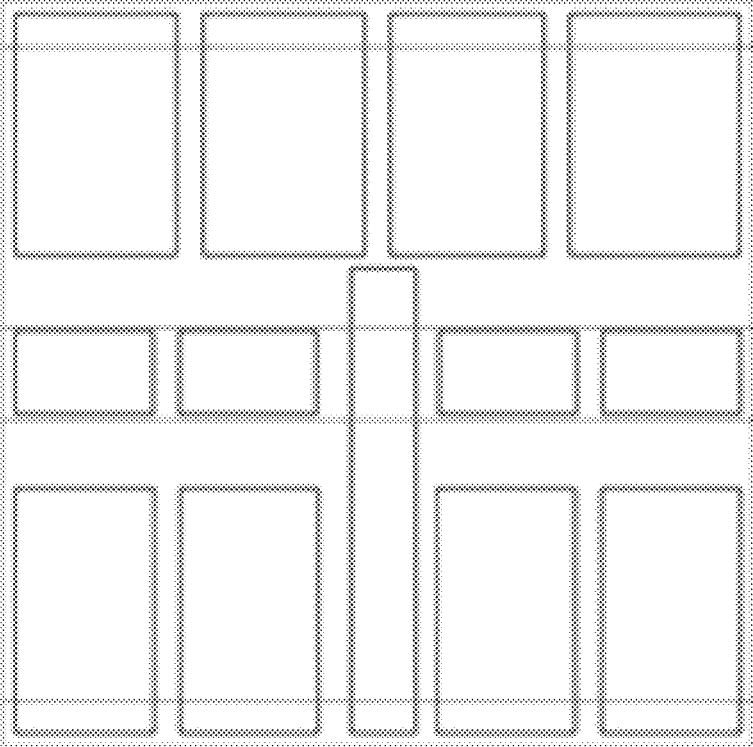
FIG. 18b is a pattern of an opening formed in a pixel defining layer on a side of the anode away from the base substrate in the display substrate.
Figure 18C:
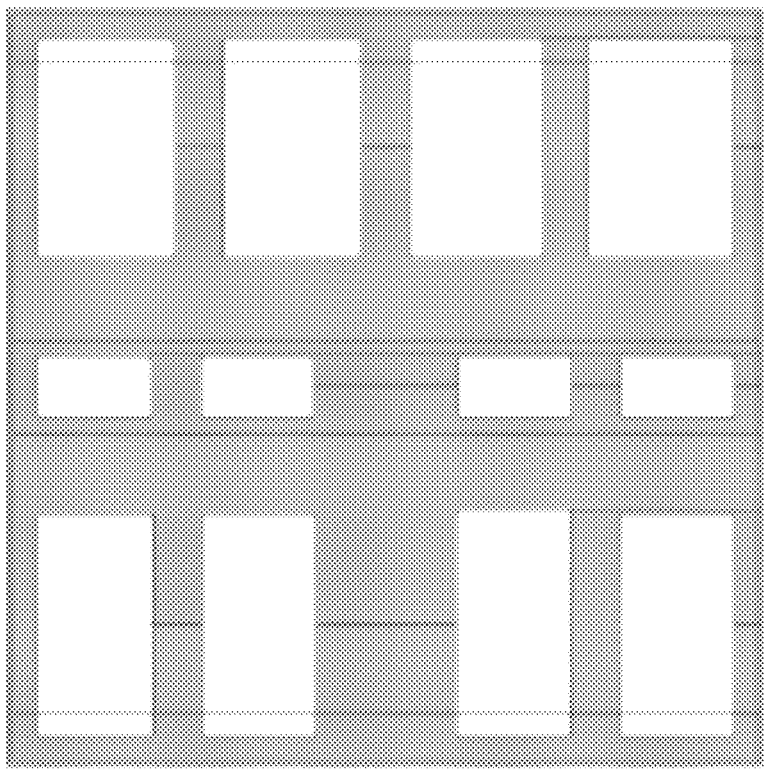
FIG. 18c is a pattern of a bank and a first black matrix on a side of the pixel defining layer away from the base substrate in the display substrate.
Figure 18D:
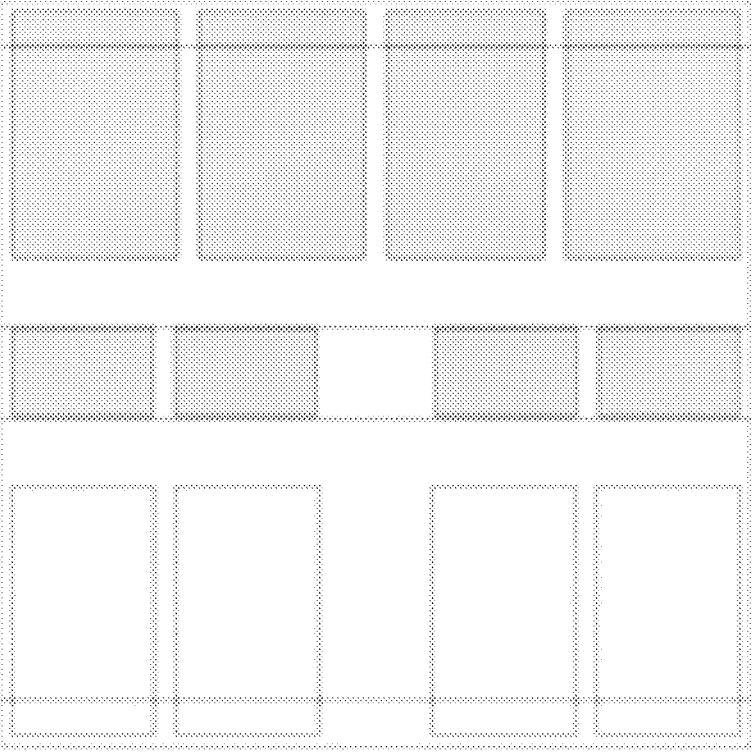
FIG. 18d is a pattern of a color conversion layer in regions separated by the bank in the display substrate.
Figure 18E:
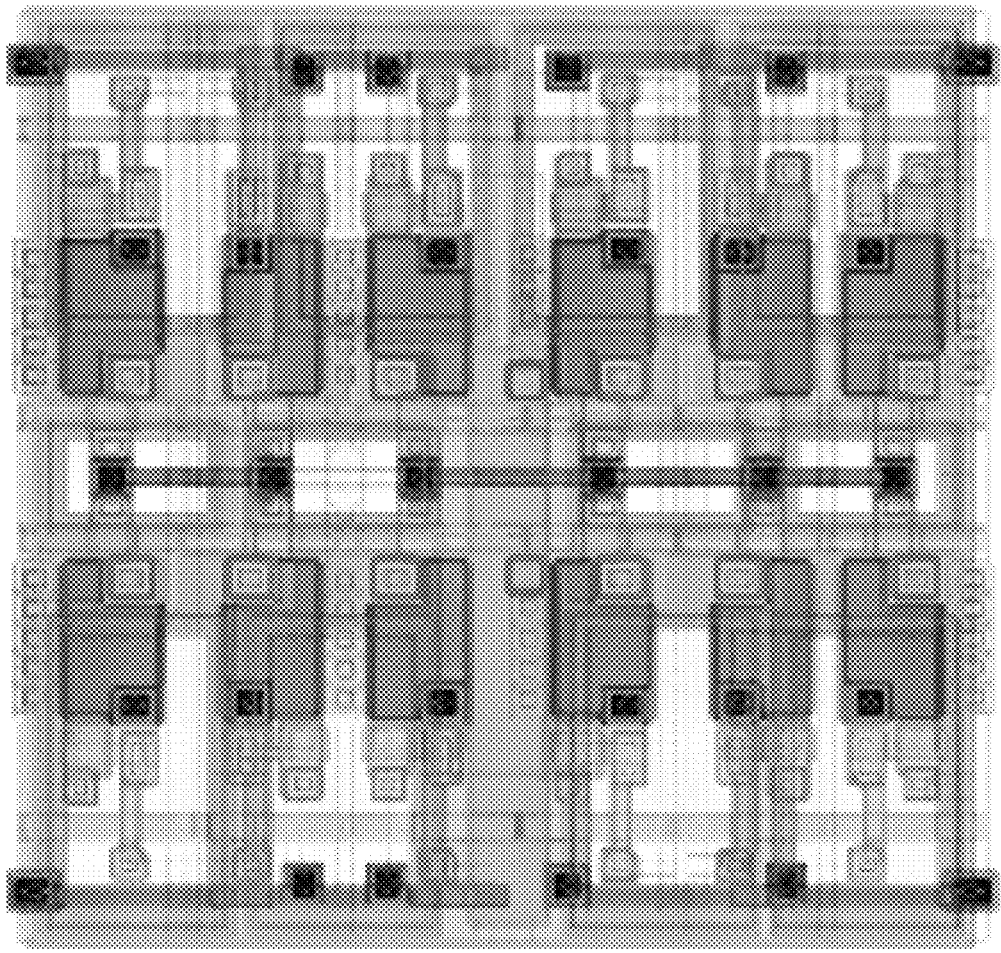
FIG. 18e is a top view of a pattern of the display substrate after the film layers in FIGS. 17a to 17d and FIGS. 18a to 18d are sequentially stacked together.

In some embodiments, referring to FIGS. 18a to 18e, FIG. 18a is a pattern of an anode, a first conductive layer, and a via in an insulating layer (e.g., a passivation layer, a planarization layer, etc.) on a side of the pattern of the source/drain electrode layer in the transistor away from the base substrate in the display substrate. FIG. 18b is a pattern of an opening formed in a pixel defining layer on a side of an anode away from the base substrate in the display substrate, each of orthographic projections of the sub-pixel and the first conductive layer on the base substrate is in an orthographic projection of the opening on the base substrate. FIG. 18c is a pattern of a bank and a first black matrix on a side of the pixel defining layer away from the base substrate in the display substrate. FIG. 18d is a pattern of a color conversion layer in regions divided by the bank in the display substrate. FIG. 18e is a top view of the display substrate after the film layers in FIGS. 17a to 17d and FIGS. 18a to 18d are sequentially stacked together. In this embodiment, the arrangement of the sub-pixels is changed, such that the orthographic projections of the first via 41 and the second via 42 on the base substrate are located in the regions between the orthographic projections of the first sub-pixel 21, the second sub-pixel 220 and the third sub-pixel 221 on the base substrate, thereby eliminating or avoiding an optical crosstalk between the first sub-pixel 21 and the second sub-pixel 220 adjacent to each other and an optical crosstalk between the first sub-pixel 21 and the third sub-pixel 221 adjacent to each other.

In some embodiments, referring to FIG. 4, the display substrate further includes a first encapsulation layer 12, a second encapsulation layer 13, and an anti-reflection layer 14; the first encapsulation layer 12 is on a side of the cathode 203 away from the base substrate 1 and on a side of the color conversion layer 7 close to the cathode 203; the second encapsulation layer 13 is on a side of the color conversion layer 7 away from the base substrate 1 and on a side of the color filter layer 10 close to the color conversion layer 7; the anti-reflection layer 14 is on a side of the color filter layer 10 away from the base substrate 1. The first encapsulation layer 12 may encapsulate the light-emitting functional layer 202 and the cathode 203 of the sub-pixel, and prevent external moisture and oxygen from entering the light-emitting functional layer 202 to damage the light-emitting functional layer 202. The second encapsulation layer 13 may encapsulate the color conversion layer 7 to protect the color conversion layer 7, and form multiple protection for the light-emitting functional layer 202 and the cathode 203 of the sub-pixel. The anti-reflection layer 14 may be a polarizer, and may prevent external light irradiated onto the display surface of the display substrate from being reflected, thereby ensuring that the display substrate may display normally.

In some embodiments, the first encapsulation layer 12 may be made of a lamination of an inorganic film layer, an organic film layer, and an inorganic film layer. The second encapsulation layer 13 may be made of an inorganic film layer.

In a second aspect, an embodiment of the present disclosure further provides a display panel, which includes the display substrate in the foregoing embodiment.

In a third aspect, an embodiment of the present disclosure further provides a display apparatus, which includes the display panel in the foregoing embodiment.

The display apparatus provided by the embodiment of the present disclosure may be any product or component with a display function, such as an OLED panel, an OLED television, a monitor, a mobile phone, a navigator or the like.

It will be understood that the above embodiments are merely exemplary embodiments adopted to illustrate the principles of the present disclosure, and the present disclosure is not limited thereto. It will be apparent to one of ordinary skill in the art that various changes and modifications may be made without departing from the spirit and scope of the present disclosure, and these changes and modifications are to be considered within the protection scope of the present disclosure.

What is claimed is:

1. A display substrate, comprising:
a base substrate;
a plurality of pixel circuits on the base substrate; and
a plurality of pixels in an array and on a side of the plurality of pixel circuits away from the base substrate;
wherein each of the plurality of pixels comprises a first sub-pixel, a second sub-pixel and a third sub-pixel; orthographic projections of the first sub-pixel, the second sub-pixel and the third sub-pixel on the base substrate do not overlap with each other; the first sub-pixel, the second sub-pixel and the third sub-pixel are electrically connected to corresponding ones of the plurality of pixel circuits in a one-to-one correspondence;
the first sub-pixel and the second sub-pixel are separated from each other by a first distance in a first direction, and a first via is arranged in the first distance;
the first sub-pixel and the third sub-pixel are separated from each other by a second distance in the first direction, and another first via is arranged in the second distance; and
the second sub-pixel and the third sub-pixel are separated from each other by a third distance in a second direction perpendicular to the first direction,
wherein each of the plurality of pixel circuits comprises a driving transistor and an insulating layer, each of the first sub-pixel, the second sub-pixel and the third sub-pixel comprises an anode; the driving transistor, the insulating layer and the anode are sequentially arranged away from the base substrate;
wherein each of the first via, the another first via and a via is formed in the insulating layer, and the first via is configured to connect the anode of the first sub-pixel to a first electrode of the driving transistor in a corresponding one of the plurality of pixel circuits, the another first via is configured to connect the anode of the second sub-pixel to a first electrode of the driving transistor in a corresponding one of plurality of pixel circuits, and the via is configured to connect the anode of the third sub-pixel to a first electrode of the driving transistor in a corresponding one of plurality of pixel circuits,
wherein the first via, the another first via and the via corresponding to the first sub-pixel, the second sub-pixel and the third sub-pixel in a same pixel are on a same line extending in the second direction,
wherein each of the plurality of pixel circuits further comprises an auxiliary electrode;
wherein the insulating layer is further provided with a second via formed for connecting a first conductive layer of the auxiliary electrode to a second conductive layer of the auxiliary electrode; and
an orthographic projection of the second via on the base substrate is between orthographic projections of two pixels adjacent to each other in the second direction on the base substrate, and between orthographic projections of two pixels adjacent to each other in the first direction on the base substrate,
the auxiliary electrode has a strip shape extending in the second direction;
an orthographic projection of the auxiliary electrode on the base substrate is between the orthographic projections of the two pixels adjacent to each other in the first direction on the base substrate, and covers the orthographic projection of the second via on the base substrate; and
a length of the auxiliary electrode in the second direction is throughout the two pixels adjacent to each other in the second direction.

2. The display substrate according to claim 1, wherein the first conductive layer is in a same layer as the anode, and an orthographic projection of the first conductive layer on the base substrate and an orthographic projection of the anode on the base substrate do not overlap with each other; and the second conductive layer is in a same layer as a first electrode and a second electrode of the driving transistor, and an orthographic projection of the second conductive layer on the base substrate and an orthographic projection of the first electrode and the second electrode of the driving transistor on the base sub strate do not overlap with each other.

3. The display substrate according to claim 2, wherein in the pixel, the second sub-pixel and the third sub-pixel are on a same side of the first sub-pixel;
the second sub-pixel and the third sub-pixel are arranged in the second direction;
the first distance is equal to the second distance; and
the third distance is less than the first distance.

4. The display substrate according to claim 3, wherein the first sub-pixel and the third sub-pixel are arranged in the first direction.

5. The display substrate according to claim 4, wherein in the pixel, a size of the first sub-pixel in the second direction is equal to a sum of sizes of the second sub-pixel, the third sub-pixel and a space between the second sub-pixel and the third sub-pixel in the second direction; and
a size of the first sub-pixel in the first direction is less than a size of any one of the second sub-pixel and the third sub-pixel in the first direction.

6. The display substrate according to claim 5, wherein an orthographic projection of the first conductive layer on the base substrate is in an orthographic projection of a spacer region between at least a part of pixels adjacent to each other in the first direction on the base substrate.

7. The display substrate according to claim 1, wherein the first sub-pixel is a blue sub-pixel; the second sub-pixel is a red sub-pixel; and the third sub-pixel is a green sub-pixel; or
the first sub-pixel is a blue sub-pixel; the second sub-pixel is a green sub-pixel; and
the third sub-pixel is a red sub-pixel.

* * * * *